US010306783B2

(12) United States Patent
Seo et al.

(10) Patent No.: US 10,306,783 B2
(45) Date of Patent: May 28, 2019

(54) FOLDABLE ELECTRONIC DEVICE INCLUDING FLEXIBLE DISPLAY

(71) Applicant: Samsung Electronics Co., Ltd., Gyeonggi-do (KR)

(72) Inventors: Jooho Seo, Seoul (KR); Dong Hun Kim, Seoul (KR); Seonkeun Park, Seoul (KR); Jinie Ryu, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/783,687

(22) Filed: Oct. 13, 2017

(65) Prior Publication Data
US 2018/0110139 A1   Apr. 19, 2018

(30) Foreign Application Priority Data
Oct. 13, 2016   (KR) .................. 10-2016-0132952

(51) Int. Cl.
*H05K 5/00* (2006.01)
*H05K 5/02* (2006.01)
(Continued)

(52) U.S. Cl.
CPC ............. *H05K 5/0017* (2013.01); *E05D 1/04* (2013.01); *E05D 7/00* (2013.01); *F16C 11/04* (2013.01);
(Continued)

(58) Field of Classification Search
CPC .. H05K 5/0217; H05K 5/0226; H05K 5/0017; H05K 5/0004; E05D 1/04; E05D 7/00
See application file for complete search history.

(56) References Cited

U.S. PATENT DOCUMENTS 8,971,032 B2 * 3/2015 Griffin .................. G06F 1/1652
                                                    345/156
9,173,287 B1   10/2015 Kim et al.
(Continued)

FOREIGN PATENT DOCUMENTS

KR   1020150104407   9/2015
KR   1020150130652   11/2015
(Continued)

OTHER PUBLICATIONS

International Search Report dated Jan. 25, 2018 issued in counterpart application No. PCT/KR2017/011339, 10 pages.

*Primary Examiner* — Hoa C Nguyen
*Assistant Examiner* — Keith DePew
(74) *Attorney, Agent, or Firm* — The Farrell Law Firm, P.C.

(57) ABSTRACT

An electronic device is provided. The electronic device includes a first housing including a first surface and a second surface, a second housing including a third surface and a fourth side, a folding portion, a flexible display disposed on the first surface and the third surface across the folding portion, and a hinge including a first planar portion disposed on the second surface, a second planar portion disposed on the fourth side, and a hinge center portion, wherein a first configuration where the folding portion is unfolded and the first housing and the second housing are parallel, and wherein a second configuration where the folding portion is folded and the first planar portion is at least partially inserted into the first housing and the second planar portion is at least partially inserted into the second housing and the first housing and the second housing are parallel.

18 Claims, 19 Drawing Sheets

(51) Int. Cl.
*F16C 11/04* (2006.01)
*E05D 1/04* (2006.01)
*E05D 7/00* (2006.01)
*H04M 1/02* (2006.01)
*G06F 1/16* (2006.01)
*E05D 3/06* (2006.01)

(52) U.S. Cl.
CPC .......... *G06F 1/1652* (2013.01); *G06F 1/1681* (2013.01); *H04M 1/0216* (2013.01); *H05K 5/0004* (2013.01); *H05K 5/0217* (2013.01); *H05K 5/0226* (2013.01); *E05D 3/06* (2013.01); *E05Y 2900/606* (2013.01); *H04M 1/0268* (2013.01)

(56) References Cited

U.S. PATENT DOCUMENTS

| | | | | |
|---|---|---|---|---|
| 9,204,565 | B1* | 12/2015 | Lee | E05D 7/00 |
| 9,395,070 | B2* | 7/2016 | Endo | H01L 27/323 |
| 9,603,271 | B2* | 3/2017 | Lee | H05K 5/0017 |
| 9,801,290 | B2* | 10/2017 | Ahn | H05K 5/0017 |
| 9,841,050 | B2* | 12/2017 | Hsu | F16C 11/04 |
| 9,869,114 | B1* | 1/2018 | Hung | E05D 3/18 |
| 2006/0146488 | A1* | 7/2006 | Kimmel | G06F 1/1616 |
| | | | | 361/679.04 |
| 2012/0044620 | A1* | 2/2012 | Song | G06F 1/1616 |
| | | | | 361/679.01 |
| 2012/0264489 | A1* | 10/2012 | Choi | H04M 1/0216 |
| | | | | 455/566 |
| 2013/0021762 | A1* | 1/2013 | van Dijk | G06F 1/1652 |
| | | | | 361/749 |
| 2014/0196254 | A1* | 7/2014 | Song | E05D 3/14 |
| | | | | 16/302 |
| 2014/0226275 | A1* | 8/2014 | Ko | G06F 1/1626 |
| | | | | 361/679.27 |
| 2015/0023031 | A1 | 1/2015 | Endo | |
| 2015/0257290 | A1 | 9/2015 | Lee | |
| 2015/0330614 | A1* | 11/2015 | Lee | F21V 21/30 |
| | | | | 362/97.1 |
| 2015/0370287 | A1* | 12/2015 | Ko | G06F 1/1626 |
| | | | | 361/749 |
| 2016/0086745 | A1 | 3/2016 | Seo et al. | |
| 2016/0139634 | A1* | 5/2016 | Cho | G06F 1/1652 |
| | | | | 361/679.27 |
| 2016/0187935 | A1* | 6/2016 | Tazbaz | G06F 1/1681 |
| | | | | 361/679.03 |
| 2016/0324023 | A1* | 11/2016 | Kim | H04M 1/0268 |
| 2016/0334836 | A1* | 11/2016 | Hong | G06F 1/1616 |
| 2016/0349802 | A1* | 12/2016 | Ahn | G06F 1/1641 |

FOREIGN PATENT DOCUMENTS

| | | |
|---|---|---|
| KR | 10-2016-0000109 | 1/2016 |
| KR | 10-1646690 | 8/2016 |

* cited by examiner

FOLDABLE ELECTRONIC DEVICE INCLUDING FLEXIBLE DISPLAY

PRIORITY

This application claims priority under 35 U.S.C. § 119(a) to a Korean Patent Application filed on Oct. 13, 2016 in the Korean Intellectual Property Office and assigned Serial No. 10-2016-0132952, the entire disclosure of which is incorporated herein by reference.

BACKGROUND

1. Field of the Disclosure

The present disclosure relates to a foldable electronic device, and more particularly, to a foldable electronic device to offset a difference in length or a difference in area between front and rear surfaces by slidably moving a hinge or a sliding portion disposed on a rear housing or the rear surface.

2. Description of the Related Art

With a significant decrease in a functional gap of each manufacturer in recent years, portable electronic devices have become slimmer to satisfy preferences of consumers and have been developed to improve convenience in use. For example, when a foldable type (or hinge type) electronic device is used among these electronic devices, the electronic device has a display area greater than or equal to that of a bar type electronic device, but a size thereof can be decreased by half by folding it when carried, thereby relatively improving portability.

Recently, since a flexible display is widely used, an effort has been made to apply a flexible display to a foldable electronic device, and research is being conducted for a housing to include a folding structure of a flexible display.

In an electronic device capable of fixing and protecting a flexible display, if the electronic device has a specific thickness, a difference in length or a difference in area of front and rear surfaces of a foldable electronic device may occur when the electronic device is folded or unfolded. For example, when the electronic device is folded, an outer surface is folded with a longer circumference than an inner surface, and thus a difference in length or a difference in area may occur between the front and rear surfaces of the electronic device according to the thickness of the electronic device. It is difficult to avoid damage or breakage of the flexible display when it is intended to solve the difference in length or the difference in area through window sliding of the flexible display disposed on the front surface.

SUMMARY

An aspect of the present disclosure provides a foldable electronic device to offset a difference in length or a difference in area between front and rear surfaces by slidably moving a hinge or a sliding portion disposed on a rear housing or the rear surface.

According to an aspect of the present disclosure, an electronic device is provided. The electronic device includes a first housing including a first surface facing a first direction and a second surface facing a second direction opposite to the first direction, a second housing including a third surface facing the first direction and a fourth side facing the second direction, a folding portion configured to couple a lateral surface of the first housing and a lateral surface of the second housing, a flexible display disposed on the first surface and the third surface across the folding portion, and a hinge including a first planar portion disposed on the second surface, a second planar portion disposed on the fourth side, and a hinge center portion configured to pivotably couple the first planar portion and the second planar portion, wherein a first configuration is configured in which the folding portion is unfolded such that the first surface and the third surface form a plane and the first housing and the second housing are parallel, and wherein a second configuration is configured in which the folding portion is folded in a direction in which the second surface and the fourth side face each other about the hinge center portion such that the first planar portion is at least partially inserted into the first housing and the second planar portion is at least partially inserted into the second housing and the first housing and the second housing are parallel.

According to another aspect of the present disclosure, an electronic device is provided. The electronic device includes a first housing and a second housing having a pre-determined thickness, a folding portion disposed between the first housing and the second housing and configured to be folded by pivoting in a first configuration in which the first housing and the second housing are unfolded and a second configuration in which the first housing and the second housing overlap with each other, a flexible display disposed on front surfaces of the first and second housings to substantially constitute the entirety of a front surface of the electronic device, and a sliding portion disposed on rear surfaces of the first and second housings to constitute at least one part of a rear surface of the electronic device, wherein the sliding portion is at least partially inserted into an inner side of the first housing and the second housing to offset a difference in area which occurs between front and rear surfaces of the electronic device when transforming from the first configuration to the second configuration depending on a folding motion of the folding portion.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF EMBODIMENTS OF THE PRESENT DISCLOSURE

Figure 1A:
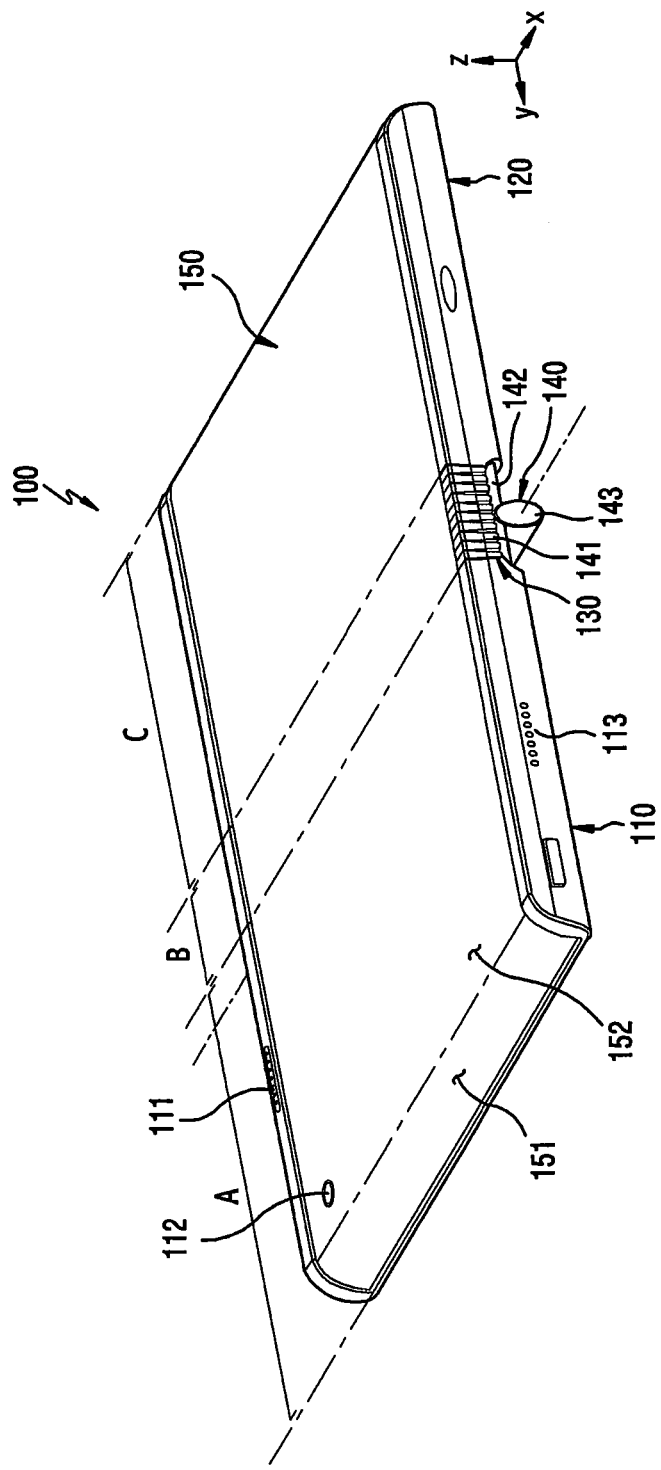
FIG. 1A is a perspective view of a front surface of a foldable (or foldable type) electronic device in a fully unfolded (open) state according to an embodiment of the present disclosure.

Hereinafter, various embodiments of the present disclosure are described with reference to the accompanying drawings. It should be understood, however, that an embodiment of the present disclosure is not intended to limit the present disclosure to the particular embodiment disclosed, but, on the contrary, it is intended to cover all modifications, equivalents, and alternatives falling within the scope of the present disclosure as defined by the appended claims and their equivalents. Like reference numerals refer to like elements throughout the accompanying drawings.

The expressions "have", "may have", "include", "may include" and the like used in the present disclosure are intended to indicate a presence of a corresponding characteristic (e.g., a number, a function, an operation, or an element such as a component), and should be understood that there are additional possibilities of one or more other characteristics.

In the present disclosure, the expressions "A or B", "A and/or B", "one or more of A and/or B" and the like may include all possible combinations of items enumerated together. For example, the expressions "A or B", "at least one of A and B", and "at least one of A or B" may indicate all cases where: (1) at least one A is included; (2) at least one B is included; and (3) at least one A and at least one B are both included.

Although expressions such as"$1^{st}$", "$2^{nd}$", "first", and "second" may be used in the present disclosure to express various elements, it is not intended to limit the corresponding elements. For example, the above expressions may be used to distinguish one element from another element. For example, a $1^{st}$ user device and a $2^{nd}$ user device are both user devices, but indicate different user devices. For example, a $1^{st}$ element may be referred to as a $2^{nd}$ element, and similarly, the $2^{nd}$ element may be referred to as the $1^{st}$ constitutional element without departing from the scope of the present disclosure.

When a certain element (e.g., a $1^{st}$ element) is described as being "operatively or communicatively coupled with/to" or "connected to" a different element (e.g., the $2^{nd}$ constitutional element), it is to be understood that the certain element is directly coupled with/to another element or can be coupled with/to the different element via another element (e.g., a 3rd element). On the other hand, when the certain element (e.g., the $1^{st}$ element) is described as being "directly coupled with/to" or "directly connected to" the different element (e.g., the $2^{nd}$ element), it may be understood that another element (e.g., the $3^{rd}$ element) is not present between the certain element and the different element.

The expression "configured to" used in the present disclosure may be used interchangeably with, for example, the expressions "suitable for", "having the capacity to", "designed to", "adapted to", "made to", and "capable of" according to a situation. The expression "configured to" may not imply only "specially designed to" in a hardware manner. Instead, in a certain situation, the expression "a device configured to" may imply that the device is "capable of" together with other devices or components. For example, the expression "a processor configured to perform A, B, and C" may imply a dedicated processor (e.g., an embedded processor) for performing a corresponding operation or a general-purpose processor (e.g., a central processing unit (CPU) or an application processor (AP)) capable of performing corresponding operations by executing one or more software programs stored in a memory device.

Terms used in the present disclosure are for the purpose of describing certain embodiments only but are not intended to limit the present disclosure. A singular expression may include a plural expression unless there is a contextually distinctive difference. Unless otherwise defined, all terms used herein have the same meanings as commonly understood by those of ordinary skill in the art. It will be further understood that terms, such as those defined in commonly used dictionaries, are intended to be interpreted as having meanings that are consistent with their meanings in the context of the relevant art, and are not intended to be interpreted in an idealized or overly formal sense unless expressly so defined herein. The terms defined in the present disclosure are not intended to be interpreted to exclude an embodiment of the present disclosure.

An electronic device according to an embodiment of the present disclosure may include, for example, at least one of a smart phone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), a moving picture experts group (MPEG-1) audio layer 3 (MP3) player, a mobile medical device, a camera, and a wearable device. A wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit).

According to an embodiment of the present disclosure, an electronic device may be a home appliance. A home appliance may include, for example, at least one of a television (TV), a digital video disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync®, Apple TV®, or Google TV™), a game console (e.g., Xbox®, PlayStation®), an electronic dictionary, an electronic key, a camcorder, and an electronic picture frame.

According to an embodiment of the present disclosure, an electronic device may include at least one of various medical devices (e.g., various portable medical measuring devices (e.g., a blood sugar measuring device, a heart rate measuring device, a blood pressure measuring device, a body temperature measuring device, etc.), magnetic resonance angiography (MRA), magnetic resonance imaging (MRI), computed tomography (CT), imaging equipment, ultrasonic instrument, etc.)), a navigation device, a global navigation satellite system (GNSS), an event data recorder (EDR), a flight data recorder (FDR), a car infotainment device, an electronic equipment for a ship (e.g., a vessel navigation device, a gyro compass, etc.), avionics, a security device, a car head unit, an industrial or domestic robot, an automated teller machine (ATM), point of sales (POS) devices, and Internet of Things (IoT) devices (e.g., a light bulb, various sensors, an electric or gas meter, a sprinkler device, a fire alarm, a thermostat, a streetlamp, a toaster, fitness equipment, a hot water tank, a heater, a boiler, etc.).

According to an embodiment of the present disclosure, an electronic device may include at least one of furniture or a part of buildings/constructions, an electronic board, an electronic signature input device, a projector, and various measurement machines (e.g., water supply, electricity, gas, propagation measurement machine, etc.). An electronic device may be one or more combinations of the aforementioned various devices. An electronic device may be a flexible device. Further, an electronic device is not limited to the aforementioned devices, but may include a newly developed electronic device.

The term "user" used in the present disclosure may refer to a person who uses an electronic device or a device which uses an electronic device (e.g., an artificial intelligence (AI) electronic device).

Hereinafter, various embodiments are described in detail with reference to the accompanying drawings. However, for convenience of explanation, elements may be exaggerated or reduced in size in the accompanying drawings. For example, a size and thickness of each element shown in the accompanying drawings are arbitrarily shown for convenience of explanation, and thus the present disclosure is not necessarily limited thereto.

Figure 1B:
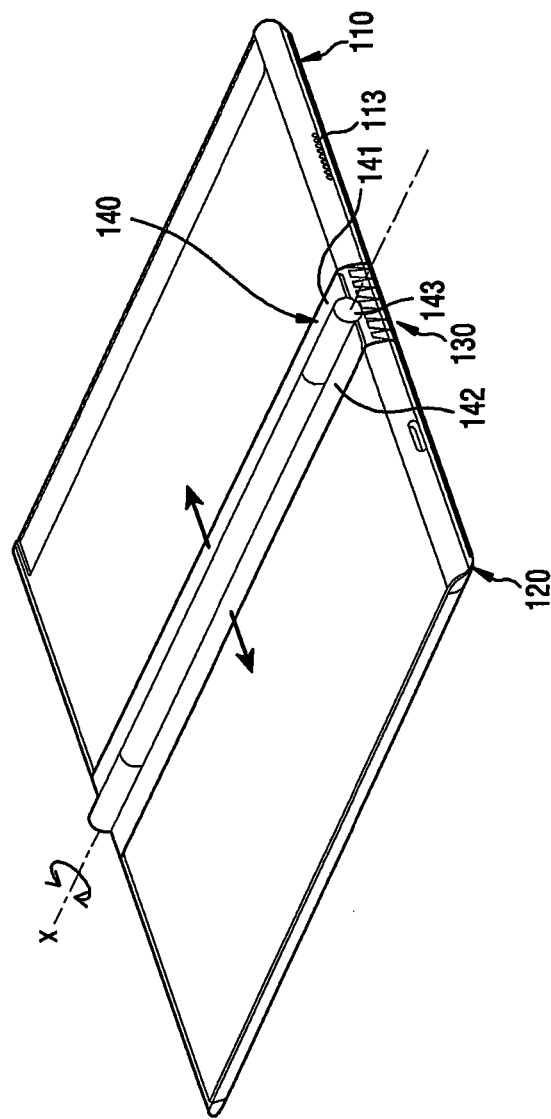
FIG. 1B is a perspective view of a rear surface of the foldable electronic device of FIG. 1A in a fully unfolded state according to an embodiment of the present disclosure.
Figure 1C:
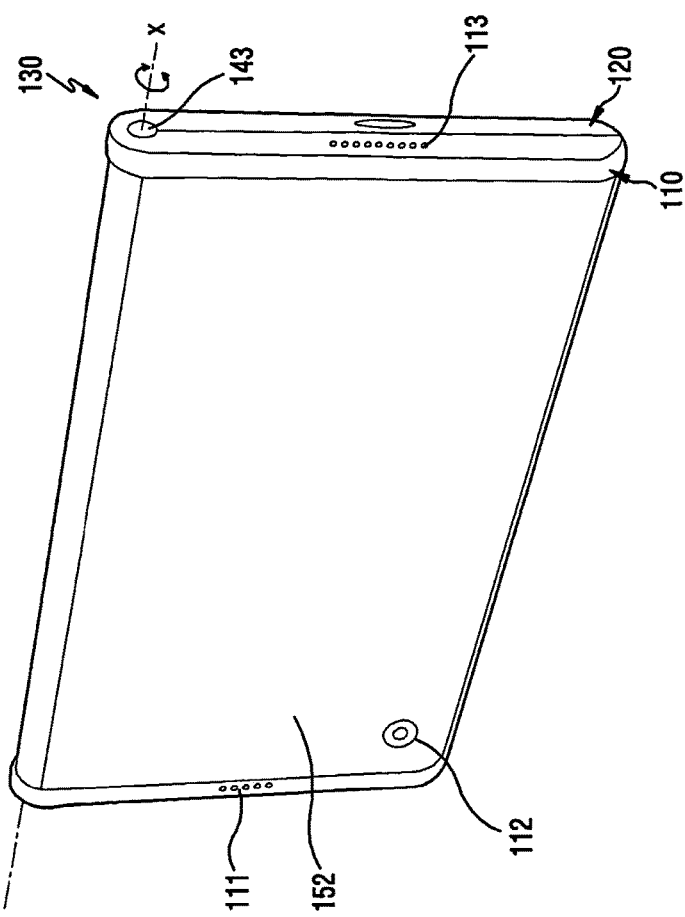
FIG. 1C is a perspective view of the foldable electronic device of FIG. 1A in a fully folded state according to an embodiment of the present disclosure.

FIG. 1A is a perspective view of a front surface of a foldable (or foldable type) electronic device in a fully unfolded (open) state according to an embodiment of the present disclosure. FIG. 1B is a perspective view of a rear surface of the foldable electronic device of FIG. 1A in a fully unfolded state according to an embodiment of the present disclosure. FIG. 1C is a perspective view of the foldable electronic device of FIG. 1A in a fully folded state according to an embodiment of the present disclosure.

Referring to FIGS. 1A, 1B, and FIG. 1C, a foldable electronic device 100 according to an embodiment of the present disclosure may include a first housing 110, a second housing 120, a folding portion 130, a hinge 140, and a flexible display 150. The first housing 110 and the second housing 120 may be coupled by means of the folding portion 130. For example, the folding portion 130 may be coupled to each of a lateral surface of the first housing 110 and its corresponding lateral surface of the second housing 120 so that the first housing 110 and the second housing 120 are pivotably coupled to each other. The hinge 140 may be disposed substantially at a center of a rear surface of the foldable electronic device 100. Therefore, the hinge 140 may constitute at least one part of an exterior of the rear surface of the foldable electronic device 100. A hinge center portion 143 may be included in a center of the hinge 140. The hinge center portion 143 may be configured to be a central axis (X-axis) of a folding motion when the first housing 110 and the second housing 120 are folded by using the folding portion 130. The flexible display 150 may be disposed on the first housing 110 and the second housing 120 across the folding portion 130. For example, the flexible display 150 may be installed to be supported by the first housing 110, the second housing 120, and the folding portion 130.

The foldable electronic device 100 according to an embodiment of the present disclosure may be folded about the folding portion 130. For example, the folding portion 130 may be disposed between the first housing 110 and second housing 120 of the foldable electronic device 100 so that the foldable electronic device 100 is bent, curved, or folded. Alternatively, the first housing 110 may pivot about the folding portion 130 by being coupled to the second housing 120 by means of the folding portion 130. In other words, the first housing 110 and the second housing 120 may be folded to face each other by pivoting the hinge center portion 143 of the hinge 140 about a pivot axis (X-axis) by means of the folding portion 130. The first housing 110 and the second housing 120 may substantially overlap with each other. Therefore, the foldable electronic device 100 may provide a first configuration in which the folding portion 130 is unfolded so that the first housing 110 and the second housing 120 form the same plane. Alternatively, the electronic device 100 may provide a second configuration in which the folding portion 130 is folded such that a rear surface of the first housing 110 and a rear surface of the second housing 120 face each other and thus the first housing 110 and the second housing 120 are disposed in parallel. The first configuration may be referred to as an unfolded configuration, and the second configuration may be referred to as a folded configuration.

According to an embodiment of the present disclosure, the folding portion 130 may be constructed of a plurality of folding members. The plurality of folding members may be pivotably coupled with each other such that the foldable electronic device 100 is foldable. For example, hinge joining may be achieved such that a plurality of neighboring folding members are pivotable with each other. Alternatively, a plurality of folding members adjacent to the first housing 110 and the second housing 120 are hinge joined with each other and thus are foldable with a pre-determined curvature in a step-wise manner when the foldable electronic device 100 is folded or unfolded. Therefore, the foldable electronic device 100 may be folded such that the rear surfaces of the first housing 110 and the second housing 120 face each other by a mutual pivot motion between the plurality of folding members included in the folding portion.

According to an embodiment of the present disclosure, the plurality of folding members may include a main body having a certain length (e.g., a pre-determined length) and both end portions disposed at both sides of the main body. A front surface of the main body of the plurality of folding members may not be exposed to the outside due to the flexible display disposed across the folding portion 130. A rear surface of the plurality of folding members may not be exposed to the outside due to the hinge 140 disposed on a rear surface of the folding portion. Therefore, only both edge portions of the plurality of folding members may be disposed at one part of an outer surface by being exposed to the outside of the foldable electronic device 100. In this case, the number of the plurality of folding members may be determined by considering a thickness of the foldable electronic device 100. Both edge portions of the plurality of folding members may include various shapes for a mutual folding function. For example, both edges of each of the plurality of folding members may include a hexagon including a gap formed in a folding direction, a circle formed in one direction, or a circle formed in both directions with respect to a most central folding member. Each of the plurality of folding members constituting the folding unit 130 are described below in greater detail.

According to an embodiment of the present disclosure, the hinge 140 may include a first planar portion 141, a second planar portion 142, and the hinge center portion 143. The hinge center portion 143 may connect the first planar portion 141 and the second planar portion 142 so that the first planar portion 141 and the second planar portion 142 are pivotable with each other. For example, a hinge arm formed to one end of the first planar portion 141 and a hinge arm formed to the second planar portion 142 may be joined to each other to constitute the hinge center portion 143. For example, the hinge arm of the first planar portion 141 and the hinge arm of the second planar portion 142, which constitute the hinge center portion 143, may be integrally formed with respect to the planar portion, or may be formed separately and fixedly coupled.

Referring to FIG. 1B, the hinge 140 may be disposed on a rear surface of the foldable electronic device 100. For example, the hinge 140 may be disposed about the hinge center portion 143 to the rear surface of the foldable electronic device 100 along a lengthwise direction (X-axis) of the folding portion 130 for connecting the first housing 110 and the second housing 120. In this case, the first planar portion 141 may be disposed to be inserted into an accommodating space included in a rear surface of the first housing 110. In addition, the second planar portion 142 may be disposed to be inserted into an accommodating space included in a rear surface of the second housing 120. For example, the first and second planar portions 141 and 142 may be disposed to slidably move in directions (indicated by arrows) of being inserted, respectively, into the accommodating spaces included in the first housing 110 and the second housing 120. In addition, the first planar portion 141 and the second planar portion 142 may be disposed to slidably move in the directions of being inserted, respectively, into the accommodating spaces included in the first housing 110 and the second housing 120. Therefore, the hinge 140 may constitute a rear exterior of the foldable electronic device 100 together with the first housing 110 and the second housing 120. Alternatively, the hinge 140 may constitute at least one part of the rear exterior of the foldable electronic device 100.

According to an embodiment of the present disclosure, the hinge center portion 143 may be a central axis (X-axis) of a folding motion of the foldable electronic device 100. For example, when the first housing 110 and the second housing 120 transform from an unfolded configuration to a folded configuration, it may be constructed to be a central axis (X-axis) of a folding motion of the folding portion 130. Alternatively, when the foldable electronic device 100 is folded from the unfolded configuration to the folded configuration, the plurality of folding members of the folding portion 130 may mutually pivot about the hinge center portion 143, and in association thereto, the first planar portion 141 and the second planar portion 142 coupled to the hinge center portion 143 may also pivot about the hinge center portion 143. Herein, the first housing 110, the second housing 120, and the folding portion 130, which constitute substantially the entirety of the foldable electronic device 100, have a certain thickness (e.g., a pre-determined thickness), and thus a difference in length (or a difference in area) may occur between a front portion to which the flexible display 150 is disposed and a rear portion to which the hinge 140 is disposed when the foldable electronic device 100 is folded and unfolded about the folding portion 130. The difference in length (or a difference in area) between the front portion and the rear portion may be offsetted (be canceled) in such a manner that the first planar portion 141 and the second planar portion 142 are inserted into accommodating spaces included in the first hosing 110 and the second housing 120. Alternatively, the difference in length (or a difference in area) between the front portion and the rear portion may be offsetted in such a manner that the first planar portion 141 and the second planar portion 142 slidably move in directions of being inserted into accommodating spaces included in the first housing 110 and the second housing 120. In other words, the hinge 130 constituting at least one part of the rear exterior of the foldable electronic device 100 may slidably move in directions of inserting the first planar portion 141 and the second planar portion 142, respectively, into inner sides of the first housing 110 and the second housing 120 depending on a pivot motion. Therefore, an area of occupying an exterior of the foldable electronic device by the first planar portion 141 and the second planar portion 142 may be reduced. Such a pivot motion and a sliding motion in which the folding portion 130 and the hinge 140 interwork is described below in greater detail.

According to an embodiment of the present disclosure, the flexible display 150 may be disposed on a front portion of the second housing 120 across the first housing 110 and the folding portion 130. The flexible display 150 may include a flexible touch screen device including a touch sensor. Alternatively, the flexible display 150 may include the touch sensor and a force sensor. As described above, the foldable electronic device 100 may be folded about the folding portion 130. The flexible display 150 is disposed from the first housing 110 to the second housing 120 across the folding portion 130, and thus may be bent together by a folding motion of the electronic device 100. For example, in the flexible display 150, an area B may be bent depending on the folding motion of the electronic device 100 unlike an area A disposed on the front surface of the first housing 110 and an area C disposed on the front surface of the second housing 120. However, the flexible display 150 may be damaged when completely bent. Therefore, the folding portion 130 is bent with a certain curvature (e.g., a pre-determined curvature), and the region B of the flexible display 150 disposed on an outer surface of the folding portion 130 may also be bent in response thereto.

According to an embodiment of the present disclosure, the flexible display 150 may further include an area which is curved not only in the area B but also in the area A or the area C disposed on the first housing 110 and the second housing 120. For example, an edge increasingly separated from the center portion of the first housing 110 may include a round shape. Therefore, the area A of the flexible display 150 may be divided into a bent display 151 corresponding to an edge portion of the first housing 110 and a planar display 152 for covering the planar portion of the first housing 110. Not only the edge of the first housing 110 but also an edge of the second housing 120 includes a round shape, and thus may include a bent display area corresponding thereto, thereby being distinguished from the planar display. In addition, the display disposed at the edge of the first housing 110 and the second housing 120 may be referred to as an edge display.

Referring to FIG. 1C, when the edges of the first housing 110 and the second housing 120 are rounded and thus the respective edges are engaged, an integral round (semi-circular) shape may be configured. In this case, when the foldable electronic device 100 is in a folded configuration, a bent area of the flexible display 150 disposed on the folding portion 130 and the edge portions of the first housing 110 and the second housing 120 may be engaged with each other. Therefore, in the folded configuration, the foldable electronic device 100 may provide an integral display in a circumferential direction via an edge display in both edge portions of the foldable electronic device 100. Alternatively, a user may be provided with a display having a seamless wide area in a circumferential direction. Alternatively, the round shape constructed by the folding portion 130 of the electronic device 100 and the edges of the first housing 110 and the second housing 120 may provide the user with an electronic device which can provide a good grip feeling regardless of a gripping direction.

According to an embodiment of the present disclosure, a speaker device 111 may be disposed on an upper side of the first housing 110 to output voice of a peer user. In addition, various components for performing various functions of the electronic device 100 may be disposed around a portion in which the speaker device 111 is installed. For example, the various components may include at least one sensor module. The sensor module may include at least one of an illumination sensor (e.g., an optical sensor), a proximity sensor, an infrared sensor, and an ultrasonic sensor. For another example, the various components may include a light emitting diode (LED) indicator for informing the user of status information of the electronic device 100. In addition, a camera device 112 may be included on an upper side of the flexible display 151 (the area A). Since the folding portion 130 is folded to expose the flexible display 150, the camera device 112 may operate both in the folded configuration and in the unfolded configuration. A microphone device 113 may be disposed on a lower side of the first housing 110 to transmit a user's voice to the peer user. As shown in FIG. 1C, another camera device 114 and component 115 may be disposed on the rear surface of the first housing 110 so as to be exposed to the outside even if the electronic device 100 is folded. The component 115 may include at least one of a flash device and a heart rate measuring device.

Figure 2:
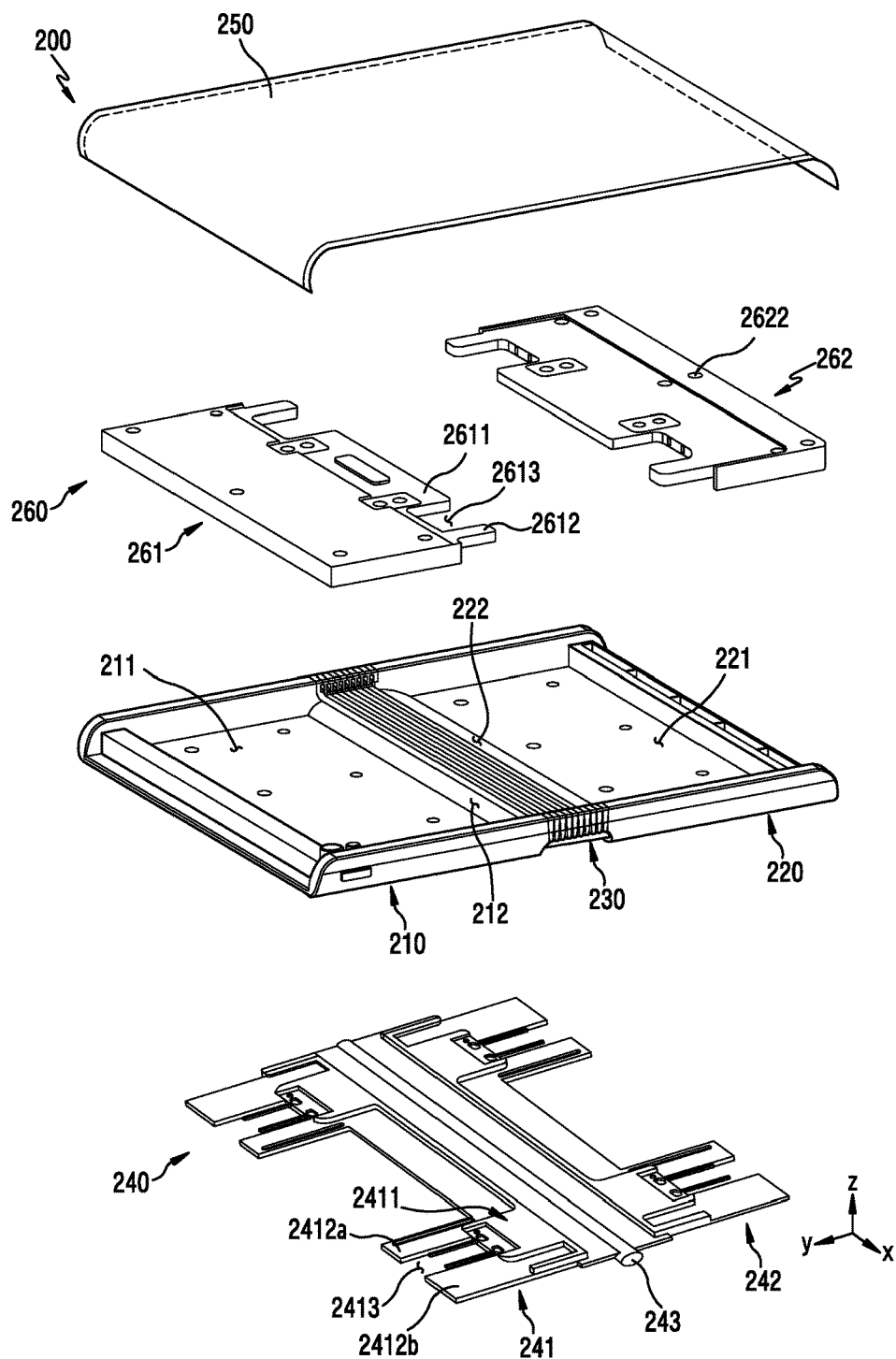
FIG. 2 is an exploded perspective view of a foldable electronic device according to an embodiment of the present disclosure.

FIG. 2 is an exploded perspective view of a foldable electronic device 200 according to an embodiment of the present disclosure.

Referring to FIG. 2, the electronic device 200 may be similar to the electronic device 100 of FIGS. 1A, 1B, and 1C or may be another example of the electronic device 200.

The foldable electronic device 200 according to an embodiment of the present disclosure may include a first housing 210, a second housing 220, a folding portion 230, a hinge 240, a flexible display 250, and a bracket 260. The first housing 210 and second housing 220 of the foldable electronic device 200 may be pivotably coupled to the folding portion 230.

According to an embodiment of the present disclosure, the first housing 210 and the second housing 220 may respectively include a first accommodating space 211 and a second accommodating space 221 capable of accommodating various components. For example, the first accommodating space 211 may include a space formed by an edge of the first housing 210 with both end portions protruding in an upward direction. Alternatively, the second accommodating space 221 may include a space formed by an edge of the second housing 220 with both end portions protruding in an upward direction. The first accommodating space 211 or the second accommodating space 221 may have various components (e.g., a processor unit, an input/output means, a storage means, and a battery) mounted thereon to perform various functions depending on a usage of the foldable electronic device 200. For example, if the foldable electronic device 200 is a multimedia terminal capable of playing video and music, the process unit may include a video/audio information processor. If the foldable electronic device 200 is a communication terminal, the process unit may include a communication module. If the various components are the input/output means, a video/audio input/output unit may be included. The first housing 210 and the second housing 220 may include a first opening 212 and a second opening 222 together with the folding portion 230. For example, the first housing 210 may be pivotably coupled to the folding portion 230 at both end portions, and a rear surface of the first housing 210 may include the first opening 212 at a position coupled to the folding portion 230. Alternatively, the second housing 220 may be pivotably coupled to the folding portion 230 at both end portions, and a rear surface of the second housing 220 may include the second opening 222 at a position coupled to the folding portion 230.

According to an embodiment of the present disclosure, the hinge 240 may include a first planar portion 241, a second planar portion 242, and a hinge center portion 243 for pivotably coupling the first planar portion 241 and the second planar portion 242. For example, a hinge arm formed at one end of the first planar portion 241 and a hinge arm formed at the second planar portion 242 may be coupled to constitute the hinge center portion 243. When constituting the hinge center portion 243, the hinge arm of the first planar portion 241 and the hinge arm of the second planar portion 242 may be integrally formed with respect to each of the planar potions, or may be formed separately and fixedly coupled. That is, a center portion of the hinge 240 may include the hinge center portion 243.

According to an embodiment of the present disclosure, the first planar portion 241 may include a guide portion 2411 protruding in an upper direction (+Z direction). The guide portion 2411 may include a coupling portion capable of including at least one guide pin. The planar portion may include at least one protrusion. For example, the first planar portion 241 may include a first protrusion 2412a and a second protrusion 2412b which face a direction (Y-axis direction) in which the hinge center portion 243 is folded. In addition, the first planar portion 241 may include a concave portion 2413 as a space between the first protrusion 2412a and the second protrusion 2412b.

Although one end of the first planar portion 241 is described above for example, the at least one guide portion, the protrusion, and the concave portion 2413 may be formed symmetrically at both ends of the first planar portion 241. Not only the first planar portion 241 but also the second planar portion 242 may include the at least one guide portion, the protrusion, and the concave portion 2413 in a symmetric manner with respect to the first planar portion 241.

According to an embodiment of the present disclosure, the hinge 240 may be mounted by being disposed on a rear surface of the foldable electronic device 200. Alternatively, the hinge 240 may be inserted into an inner side of the rear surface of the foldable electronic device 200. For example, the first planar portion 241 and second planar portion 242 of the hinge 240 may be mounted by being inserted respectively to the first opening 212 of the first housing 210 and the second opening 222 of the second housing 220. The hinge center portion 243 of the hinge 240 may be disposed at a center portion of the folding portion 230, and the first planar portion 241 and the second planar portion 242 may be inserted respectively to the first opening 212 and the second opening 222 in a symmetric manner with respect to the hinge center portion 243. The hinge center portion 243 may be coupled by being fixed to a central folding member among a plurality of folding members of the folding portion 230. In this case, if the folding portion 230 is folded about a pivot axis, the hinge center portion 243 and the folding member coupled to the hinge center portion 243 may be folded depending on a pivot motion of the plurality of folding members of the folding portion 230. The hinge 240 may be coupled to the first housing 210, the second housing 220, and the folding portion 230, but may not be fixedly coupled. That is, the hinge center portion 243 is not fixedly coupled to the folding portion 230 but has a degree of freedom, whereas the first planar portion 241 and the second planar portion 242 are respectively inserted into spaces defined by the first housing 210 and the second housing 220. Thus, the hinge 240 may be disposed not to be spaced apart from a rear surface of the electronic device 200. For example, the first planar portion 241 may be inserted into the first opening 212 of the first housing 210. The second planar portion 242 may be inserted into the second opening 222 of the second housing 220. The first planar portion 241 and the second planar portion 242 may be configured to be slidable in a lengthwise direction (Y-axis) of the electronic device 200 by being inserted into the first opening 212 and the second opening 222. Such a structure in which the first planar portion 241 and the second planar portion 242 are inserted into the first housing 210 and the second housing 220 is described below in greater detail.

According to an embodiment of the present disclosure, the flexible display 250 may be disposed to cover the first housing 210 and the second housing 220 across the folding portion 230. For example, the flexible display may be disposed in a coupling manner from an edge and both end portions of the first housing 210 to both ends and an edge of the second housing 220 across both end portions of the folding member 230. At least one part of the flexible display 250 disposed at the folding portion 230 may be constructed of a display capable of being curved. Each of the first housing 210 and the second housing 220 f both edges of the electronic device 200 may include a round shape. Therefore, at least one part of the flexible display disposed at both edges of the electronic device 200 may be constructed of the display capable of being curved. The flexible display 250 may include a flexible touch screen device including a touch sensor. The flexible display 250 may include a touch sensor and a force sensor.

According to an embodiment of the present disclosure, the bracket 260 may include a first bracket 261 and a second bracket 262. The first bracket 261 may be mounted to the first accommodating space 211 of the first housing 210, and the second bracket 262 may be mounted to the second accommodating space 221 of the second housing 220. For example, the second bracket 262 may include a plurality of coupling openings 2622. Accordingly, the second bracket 262 may be coupled with the second accommodating space 221 of the second housing 220 by means of a joining means. The first bracket 261 and the second bracket 262 may provide a space for mounting various components (e.g., a processor unit, an input/output means, a storage means, and a battery) together with the first and second accommodating spaces 211 and 221 of the first and second housings 210 and 220. The first bracket 261 may include at least one convex portion and a concave portion 2613. For example, the first bracket 261 may include a central protrusion 2611 and an outer protrusion 2612 protruding in a direction (−Y-axis direction) opposite to a folding direction, and the concave portion 2613 which is a space formed between the central protrusion 2611 and the outer protrusion 2612. The central protrusion 2611, the outer protrusion 2612, and the concave portion 2613 of the first bracket 261 may include the first protrusion 2412a, the second protrusion 2412b, and the concave portion 2413 included in the first planar portion 241 of the hinge 240. In addition, a thickness of the outer protrusion 2612 and the central protrusion 2611 may be less than a total thickness of the first bracket 261. That is, an accommodating space for inserting the first planar portion 241, the guide portion 2411, the first protrusion 2412a, the second protrusion 2412b, and the concave portion 2413 may be included in a lower side of the first bracket 261 together with the outer protrusion 2612, the central protrusion 2611, and the concave portion 2613. Therefore, the guide portion 2411 and first protrusion 2412a and the second protrusion 2412b of the first planar portion 241 may be inserted into an accommodating space included in the first bracket 261 and thus may slidably moved in a direction (Y-axis direction) in which the electronic device 200 is folded. In addition, a motion in another direction may be restricted by the central protrusion 2611, the outer protrusion 2612, and the concave portion 2613 included in the first bracket 261. Due to the restriction on the motion of the first planar portion 241, the hinge 240 including the first planar portion 241 may be disposed on the rear surface of the electronic device 200 so as not to be spaced apart from the rear surface of the electronic device 200.

Although one end of the first bracket 261 is described above for example, at least one protrusion and concave portion may be formed symmetrically at both ends of the first bracket 261, and not only the first bracket 261 but also the second bracket 262 may include at least one protrusion and concave portion symmetrically with respect to the second bracket 262. In addition, similarly to the first bracket 261 which provides a space for inserting the first planar portion 241, the second bracket 262 may provide a space for inserting the second planar portion 242. Therefore, the hinge 240 is mounted to an accommodating space provided by the first bracket 261 and the second bracket 262 and a sliding motion is restricted. In this manner, the hinge 240 may be disposed on the rear surface of the electronic device 200 so as not to be spaced apart from the rear surface of the electronic device 200. A structure in which the hinge 240 is mounted to the bracket 260 will be described below in detail.

Figure 3:
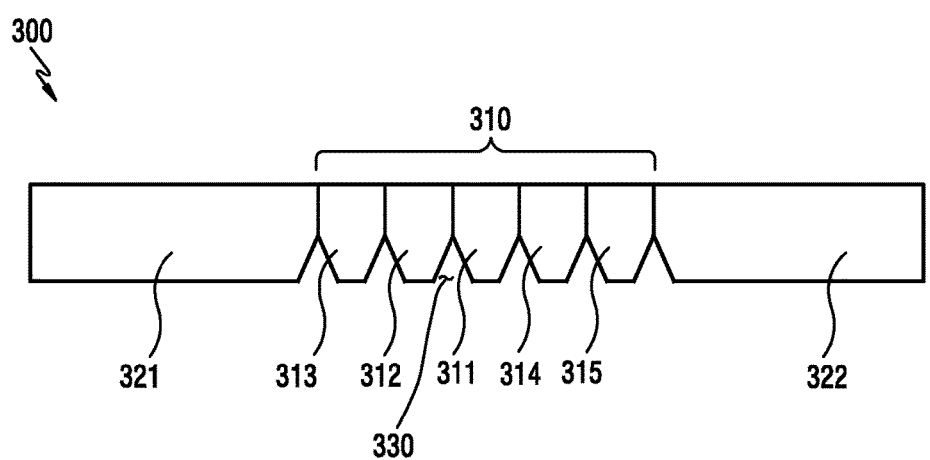
FIG. 3 is a lateral view of a folding portion of a foldable electronic device according to an embodiment of the present disclosure.

FIG. 3 is a lateral view of a folding portion of a foldable electronic device 300 according to an embodiment of the present disclosure.

Referring to FIG. 3, a structure in which a folding portion 310 is disposed at a 5:5 point (middle point) of the foldable electronic device 300 so that a first housing 321 and a second housing 322 of the foldable electronic device 300 are mutually folded by means of a folding portion 310 is described below.

According to an embodiment of the present disclosure, the folding portion 310 may be disposed between the first housing 321 and the second housing 322 of the foldable electronic device 300 so that the foldable electronic device 300 is bent, curved, or folded. For this, the folding portion 310 may include a plurality of folding members 311. A folding function may be performed by a connection between the respective folding members 311. As described above, only both end portions of the folding member 310 may be disposed as one part of an outer surface by being exposed to the outside in the foldable electronic device 300. In this case, the number of the plurality of folding members 311, 312, 313, 314, and 315 may be determined by considering a thickness of the foldable electronic device. Hereinafter, the folding portion 310 constructed of 5 folding members is described below.

According to an embodiment of the present disclosure, the folding portion 310 may include the first to fifth folding members 311 to 315. In this case, the number of folding members which constitute the folding portion 310 is not necessarily limited to 5. However, the optimal number of folding members of the folding portion may be determined by considering a thickness of the flexible display and a thickness of a main body. Among the first to fifth folding members 311 to 315, second and third folding members 312 and 313 and fourth and fifth folding members 314 and 315 may be disposed symmetrically with respect to the first folding member 311. The respective folding members 311 to 315 may be pivotably coupled with each other by means of a hinge structure. In addition, the third and fifth folding members 313 and 315 may be connected respectively to the first housing 321 and the second housing 322. A hinge structure of each of the folding members 311 to 315 provides only a mutual link but does not include a gear structure, and thus each of the plurality of folding members 311 to 315 may freely perform a pivot motion in a separate manner.

According to an embodiment of the present disclosure, a shape of both ends of the folding portion 310 may include a hexagon. Alternatively, a shape of both ends of each of the first to fifth folding members 311 to 315 may include a hexagon. For example, each of the first to fifth folding members 311 to 315 may include a hexagonal shape of which a lower side has a narrower width than an upper side. Therefore, the first to fifth folding members 311 to 315 may include a mutually constant gap 330. Therefore, the first to fifth folding members 311 to 315 may pivot in a direction including a mutual gap, and thus the first housing 321 and the second housing 322 may be folded in directions mutually facing each other. That is, the first to fifth folding members 311 to 315 may mutually pivot to be folded by the mutual gap. However, since a topside of each of the first to fifth folding members does not include the mutual gap, a pivot motion in an opposite direction may be restricted.

Figure 4:
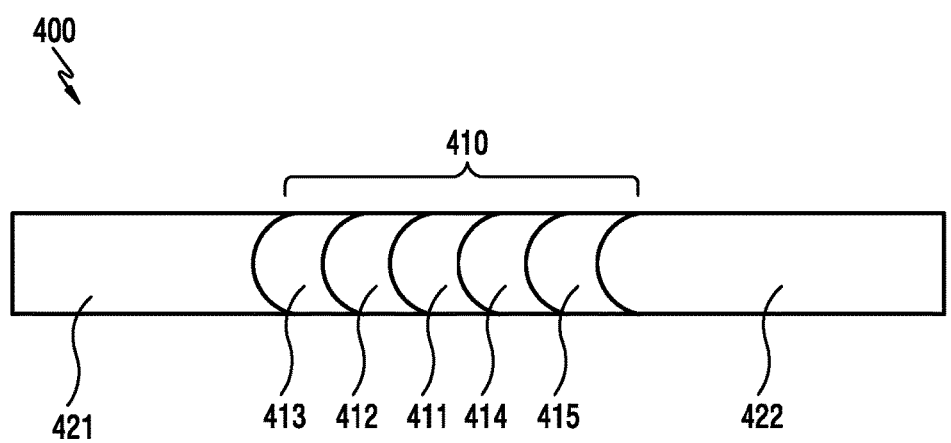
FIG. 4 is a lateral view of a folding portion of a foldable electronic device according to an embodiment of the present disclosure.

FIG. 4 is a lateral view of a folding portion 410 of a foldable electronic device 400 according to an embodiment of the present disclosure.

Referring to FIG. 4, a structure of both end portions of the folding portion 410 of the foldable electronic device 400 is described below.

According to an embodiment of the present disclosure, the folding portion 410 may include first to fifth folding members 411, 412, 413, 414, and 415. In this case, the number of folding members which constitute the folding portion 410 is not necessarily limited to 5. However, the optimal number of folding members of the folding portion may be determined by considering a thickness of the flexible display and a thickness of a main body. Among the first to fifth folding members 411 to 415, second and third folding members 412 and 413 and fourth and fifth folding members 414 and 415 may be disposed symmetrically with respect to the first folding member 411. The respective folding members 411 to 415 may be pivotably coupled with each other by means of a hinge structure. In addition, the third and fifth folding members 413 and 415 may be connected respectively to a first housing 421 and a second housing 422.

According to an embodiment of the present disclosure, both end portions of the folding portion 410 may be formed in a circular shape. Alternatively, each of the first to fifth folding members 411 to 415 may have a circular end portion facing one direction. Alternatively, end portions of the first to fifth folding members 411 to 415 may, respectively, include first and second outer circumferential surfaces in a direction facing the first housing 421. For example, a first outer circumferential surface disposed in a direction of the first housing 421 of the first folding member 411 and a second outer circumferential surface disposed in a direction of the second housing 422 of the second folding member 412 may be tightly in contact with each other to achieve an area contact. If the first to fifth folding members 411 to 415 pivot with each other by means of a hinge, the first outer circumferential surface and the second outer circumferential surface may mutually slidably move. That is, when the first to fifth folding members 411 to 415 perform a pivot motion, a mutual gap may be minimized. Alternatively, the folding members may be configured to be seen as one entity in a folded configuration.

Figure 5:
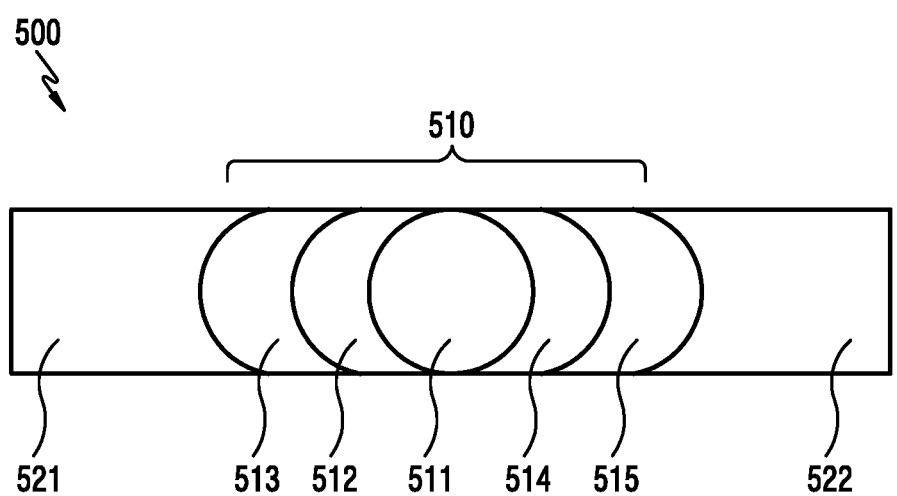
FIG. 5 is a lateral view of a folding portion of a foldable electronic device according to an embodiment of the present disclosure.

FIG. 5 is a lateral view of a folding portion 510 of a foldable electronic device 500 according to an embodiment of the present disclosure.

Referring to FIG. 5, a structure of both end portions of the folding portion 510 of the foldable electronic device 500 is described below.

According to an embodiment of the present disclosure, both end portions of the folding portion 510 may be formed in a circular shape. However, unlike in the exemplary embodiments shown in FIG. 4, each of first to fifth folding members 511, 512, 513, 514, and 515 may have a circular end portion facing both directions. For example, an end portion of the first folding member 511 may include a completely circular shape, each of the second and third folding members 512 and 513 may include a circular shape facing the first housing 521, and each of the fourth and fifth folding members 514 and 515 may include a circular shape facing the second housing 522. When the first to fifth folding members 511 to 515 pivot about the first folding member 511, each of the second to fifth folding members 512 to 515 including a circular-shaped end portion formed in both directions may move slidably with each other. That is, when the first to fifth folding members 511 to 515 perform a pivot motion, a mutual gap may be minimized. Alternatively, the folding members may be configured to be seen as one entity in a folded configuration.

Figure 6:
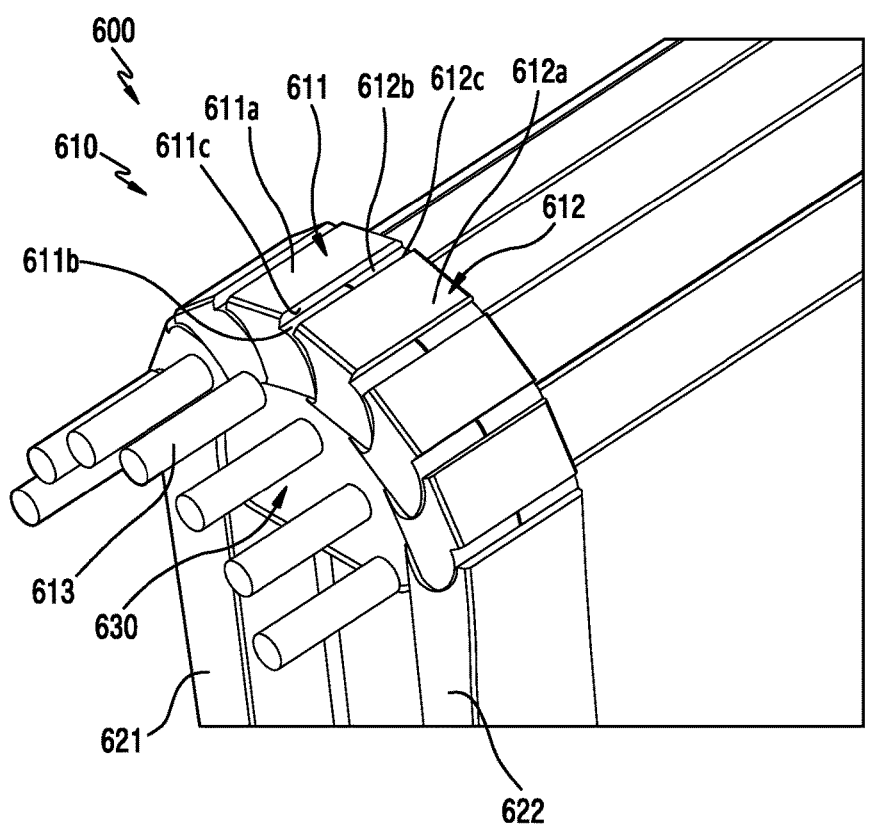
FIG. 6 is a perspective view of a folding portion of a foldable electronic device in a folded state according to an embodiment of the present disclosure, wherein a flexible display is removed.

FIG. 6 is a perspective view of a folding portion 610 of a foldable electronic device 600 in a folded state according to an embodiment of the present disclosure, in which a flexible display is removed.

Referring to FIG. 6, the folding portion 610 according to an embodiment of the present disclosure may be disposed substantially in a middle portion of the foldable electronic device 600. The foldable electronic device 600 may include a structure in which a first housing 621 and a second housing 622 are foldable with each other by the folding portion 610 about a hinge center portion of the hinge 630 as a central axis. The plurality of folding members may include a main body having a certain length and both end portions disposed at both sides of the main body. A front surface of the main body of the plurality of folding members may not be exposed to the outside due to the flexible display disposed across the folding portion 610. A rear surface of the plurality of folding members may not be exposed to the outside due to the hinge 630 disposed on a rear surface of the folding portion 610. Therefore, only both edge portions of the plurality of folding members may be disposed as one part of an outer surface by being exposed to the outside of the foldable electronic device 600. In this case, the number of the plurality of folding members may be determined by considering a thickness of the foldable electronic device 600. Hereinafter, among the plurality of folding members included in the folding portion 610, a first folding member 611 and a second folding member 612 will be taken for example in the following description.

One end portion of the first folding member 611 according to an embodiment of the present disclosure may include an outer portion 611a, a first hinge arm 611b, and a first step portion 611c formed by the outer portion 611a and the first hinge arm 611b. In addition, one end portion of the second folding member 612 may include an outer portion 612a, a second hinge arm 612b, and a second step portion 612c formed by the outer portion 612a and the second hinge arm 612b. The first hinge arm 611b of the first folding member 611 may be hinge-coupled to be mutually pivotable with the second hinge arm 612b of the second folding member 612. For example, the first hinge arm 611b and the second hinge arm 612b may be hinge-coupled by using a hinge pin 613. Therefore, the first folding member 611 and the second folding member 612 may pivot with each other about the hinge pin 613 as a pivot axis. The first step portion 611c of the first folding member 611 and the second step portion 612c of the second folding member 612 may restrict pivoting between the first folding member 611 and the second folding member 612. For example, if the first housing 621 and the second housing 622 are unfolded in an upward direction, the first step portion 611c and the second step potion 612c are mutually trapped (interrupted) and thus may be restricted from being unfolded by more than 180 degrees. For example, when the first step portion 611c and the second step portion 612c are trapped with each other and thus are unfolded by 180 degrees, the outer portion 611a of the first folding member 611 and the outer portion 612a of the second folding member 612a may form an integral surface. That is, the first step portion 611c and the second step portion 612c may play a role of restricting a transformation in which the first housing 621 and the second housing 622 are unfolded in an upward direction by means of the folding portion 610. Therefore, the first step portion 611c and the second step portion 612c may be referred to as a stopper of a pivot motion.

Figure 7A:
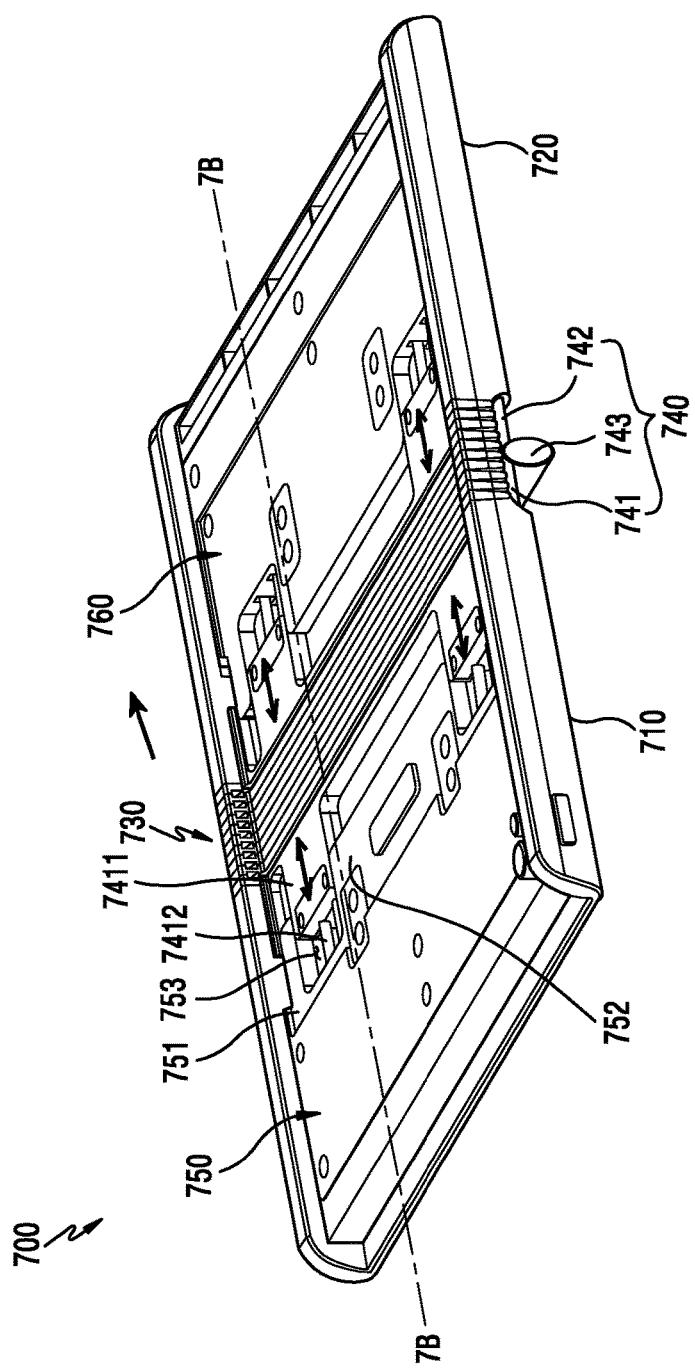
FIG. 7A is a perspective view of an inner portion of a foldable electronic device according to an embodiment of the present disclosure.
Figure 7B:
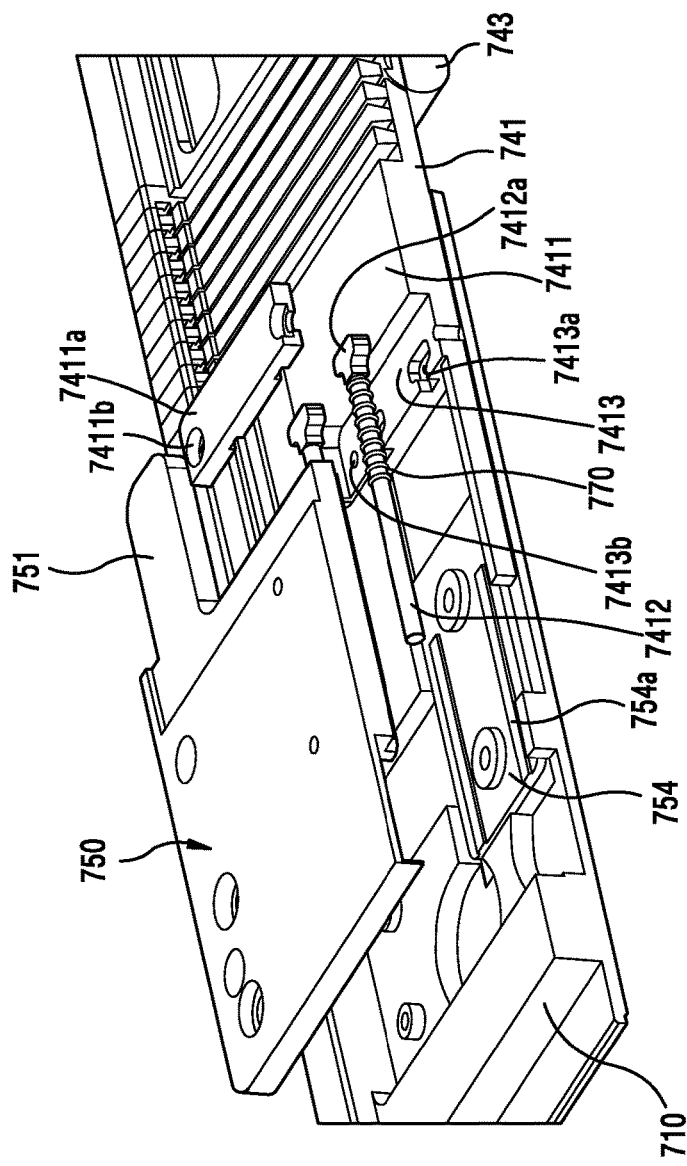
FIG. 7B is a perspective view, taken in cross-section along lines 7B-7B of FIG. 7A, according to an embodiment of the present disclosure.

FIG. 7A is a perspective view of an inner portion of a foldable electronic device 700 according to an embodiment of the present disclosure of the present disclosure. FIG. 7B is a perspective view taken in cross-section along line 7B-7B of FIG. 7A.

Referring to FIGS. 7A and 7B, a structure in which a first planar portion 741 of a hinge 740 is mounted to a first housing 710 and a first bracket 750 is described below.

According to an embodiment of the present disclosure, the foldable electronic device 700 may include the first housing 710, a second housing 720, a folding portion 730, the hinge 740, and the bracket 750. The first housing 710 and the second housing 720 may be connected by means of the folding portion 730 disposed therebetween. The folding portion 730 may be constructed of a plurality of folding members including a hinge structure to be pivotable with each other. The hinge 740 may include the first planar portion 741, a second planar portion 742, and a hinge center portion 743. The hinge center portion 743 may be assembled with the first housing 710 and the second housing 720 so as to be disposed substantially at a center of the foldable electronic device 700. For example, the hinge center portion 743 may be disposed at a central location of the folding portion 730, and the first planar portion 741 and the second planar portion 742 may be disposed at both sides facing the first housing 710 and the second housing 720 with respect to the hinge center portion 743. For example, the first planar portion 741 may be disposed by being inserted into a first opening formed between the first housing 710 and the folding portion 730, and the second planar portion 742 may be disposed by being inserted into a second opening formed between the second housing 720 and the folding portion 730. That is, each of the first housing 710 and the second housing 720 may define a space in which the first planar portion 741 and the second planar portion 742 can be accommodated. The first housing 710 and the second housing 720 may mount a bracket. For example, the first bracket 750 may be mounted to a space between both end portions of the first housing 710. In addition, the bracket 750 may be mounted to cover at least one part of the first planar portion 741 inserted into the first housing 710. Therefore, the first bracket 750 may play a role of a guide for restricting a motion of the first planar portion 741 in a vertical direction (or a thickness direction). In addition, a second bracket 760 disposed on the second housing 720 may play role of a guide for restricting a vertical-directional motion of the second planar portion 742 inserted into the second housing 720. That is, the hinge 740 may be tightly in contact without being spaced apart from the first housing 710, the second housing 720, and the folding portion 730 through the first and second planar portions 741 and 742 of which a vertical-directional motion is restricted by means of the first bracket 750 and a second bracket 760.

According to an embodiment of the present disclosure, the first bracket 750 may include an outer protrusion 751, a central protrusion 752, and a concave portion 753 between the central protrusion 752 and the outer protrusion 751. In addition, the first planar portion 741 of the hinge 740 may include a guide portion 7411 protruding in an upward direction. The concave portion 753 of the first bracket 750 may include a shape corresponding to the guide portion 7411 so that the guide portion 7411 is properly entered when the first bracket 750 and the first planar portion 741 are mounted to a space provided by the first housing 710. At least one guide pin 7412 may be further included between the guide portion 7411 and the concave portion 753. The guide pin 7412 may play a role of a guide in a sliding motion of the first planar portion by being fixed to the guide portion 7411 and by being inserted into a guide groove formed on the concave portion 753 of the first bracket 750.

Referring to FIG. 7B, the first planar portion 741 according to various exemplary embodiments may include the guide portion 7411 and the guide pin 7412. The guide pin 7412 may be fixedly coupled to the guide portion 7411. For example, the guide portion 7411 may include a coupling end 7413 capable of fixing the guide pin 7412. The coupling end 7413 may include a coupling hole 7413a capable of fixing one end 7412a of the guide pin 7412. According to one exemplary embodiment, the coupling end 7413 may be coupled with a cover 7411a. One end 7412a of the guide pin 7412 may be coupled to the coupling hole 7413a of the coupling end 7413, and thereafter the cover 7411a may be coupled to the coupling end in an inserting manner. For example, it may be fixedly coupled to the coupling hole 7413b of the coupling end 7413 and a cover hole 7411b of the cover 7411 by means of a joining means (e.g., a bolt, a nut, etc.).

According to an embodiment of the present disclosure, the first bracket 750 may further include a guide bracket 754. The guide bracket 754 may be disposed on a lower side of the first bracket 750. The guide bracket 754 may include a guide reed 754a protruding in an upward direction. The guide bracket 754, the guide reed 754a, and the first bracket 750 may provide a guide groove capable of accommodating the guide pin 7412 together. Accordingly, the guide pin 7412 of the first planar portion 741 may slidably move in a folding direction (Y-axis) by being interrupted by the guide groove provided by the first bracket 740 and the guide bracket 754.

Although one end of the first planar portion 741 is described above for example, a coupling structure of the guide pin and the guide bracket may be formed symmetrically at both ends of the first planar portion 741. Not only the first planar portion 741 but also the second planar portion 742 may include a coupling structure of a guide pin symmetrically with respect to the first planar portion 741.

According to an embodiment of the present disclosure, an elastic member 770 disposed between the guide pin 7412 and the first bracket 750 may be included. For example, the elastic member 770 may be disposed by being coupled to wrap the guide pin 7412. For example, the elastic member 770 may include a spring member, and one end of the elastic member may be interrupted by the first guide portion 7411 of the first planar portion 741, and the other end may be interrupted by the first bracket 750 or the guide bracket 754. Therefore, the elastic member 770 may be disposed between the first bracket 750 and the first guide portion 7411 to provide elastic force in a direction opposite to a direction of inserting the first planer portion 741. The elastic force may contribute to a smooth unfolding motion of the folding portion 730 of the foldable electronic device 700. Alternatively, it may contribute to maintaining an unfolded configuration of the foldable electronic device 700.

Although only the elastic member coupled to one guide pin is described above for example, according to an embodiment of the present disclosure, the foldable electronic device may include an elastic member for each of the plurality of guide pins.

Figure 8A:
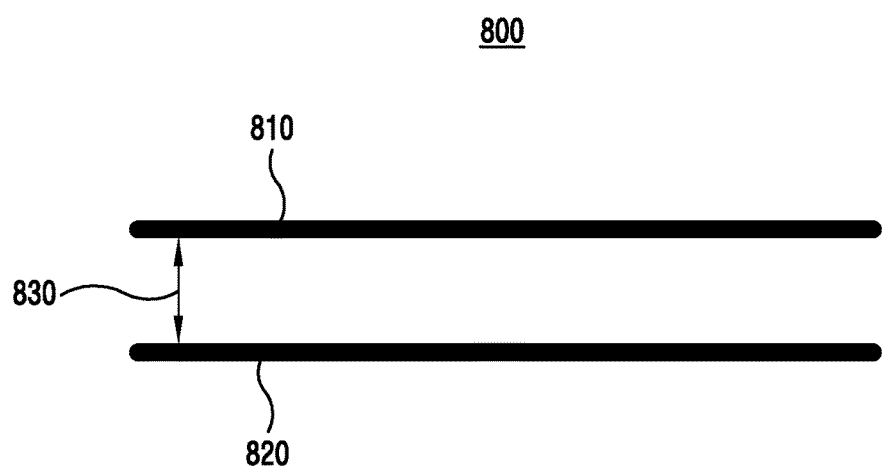
FIG. 8A is an illustration of a foldable electronic device in a fully unfolded state according to an embodiment of the present disclosure.
Figure 8B:
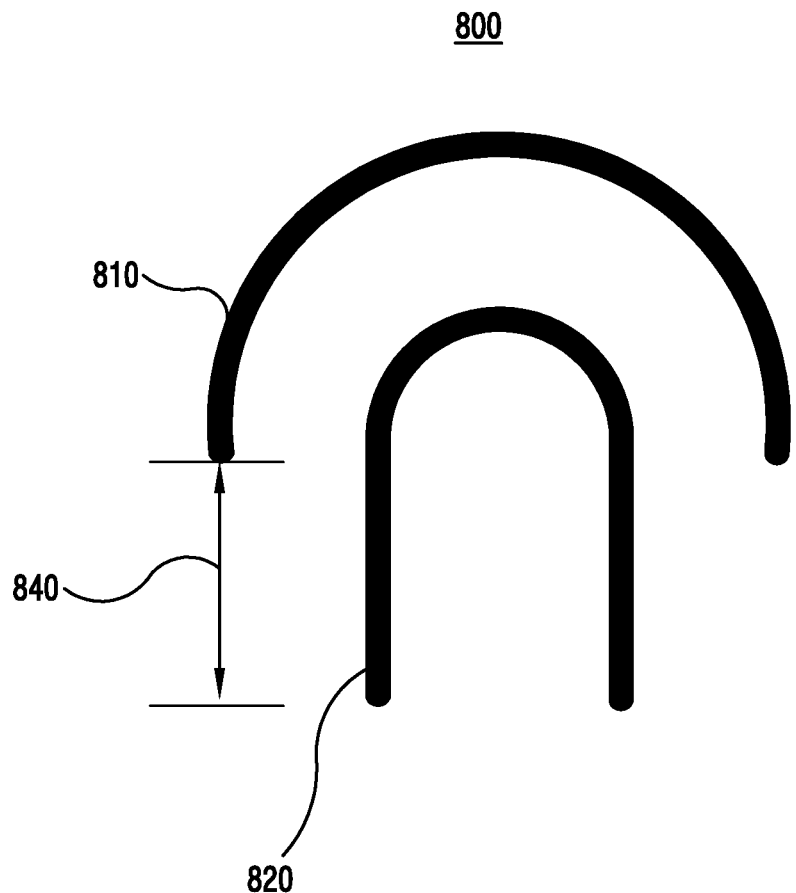
FIG. 8B is an illustration of a foldable electronic device in a fully folded state according to an embodiment of the present disclosure.

FIG. 8A is an illustration of a foldable electronic device 800 in a fully unfolded state according to an embodiment of the present disclosure. FIG. 8B is an illustration of the foldable electronic device 800 in a fully folded state according to an embodiment of the present disclosure.

Referring to FIG. 8A, in the foldable electronic device 800, a front housing 810 and a rear housing 820 may be disposed to have a certain thickness 830. In a state in which the foldable electronic device 800 is fully unfolded, the front housing 810 and the rear housing 820 may have the same length in a horizontal direction.

Referring to FIG. 8B, in a state in which the foldable electronic device 800 is folded in a downward direction by being curved substantially in a center portion, lengths of the front housing 810 and the rear housing 820 may have a certain difference in length 840 (or a difference in area) in a vertical direction. That is, when an electronic device having a certain thickness is folded in a certain direction, a circumferential difference in length corresponding to a thickness of the front housing 810 and the rear housing 820 may be included, and a difference in length may occur between the front housing 810 and the rear housing 820 in a folded configuration on the basis of the circumferential difference in length. To solve this issue, the foldable electronic device 800 according to an embodiment of the present disclosure may provide a structure capable of cancelling the difference in length by slidably moving at least one part of the front housing 810 or the rear housing 820.

Figure 9A:
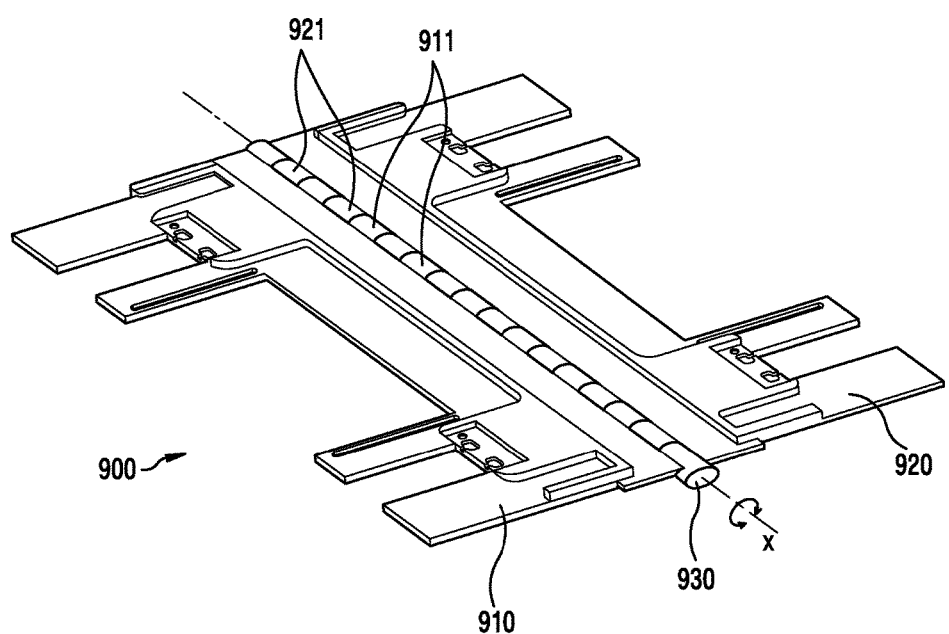
FIG. 9A is a perspective view of a hinge in a fully unfolded state according to an embodiment of the present disclosure.
Figure 9B:
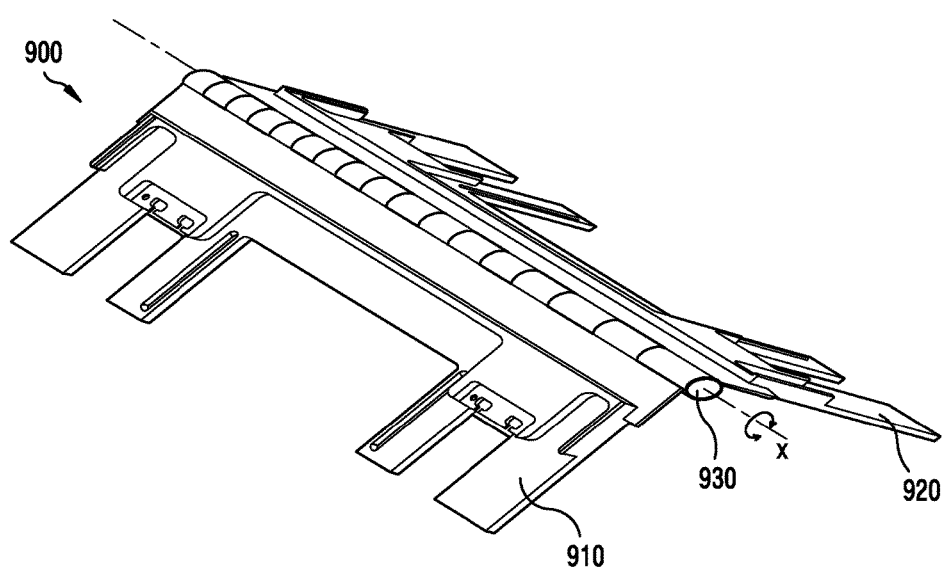
FIG. 9B is a perspective view of the hinge of FIG. 9A in a folded state by a certain angle according to an embodiment of the present disclosure.
Figure 9C:
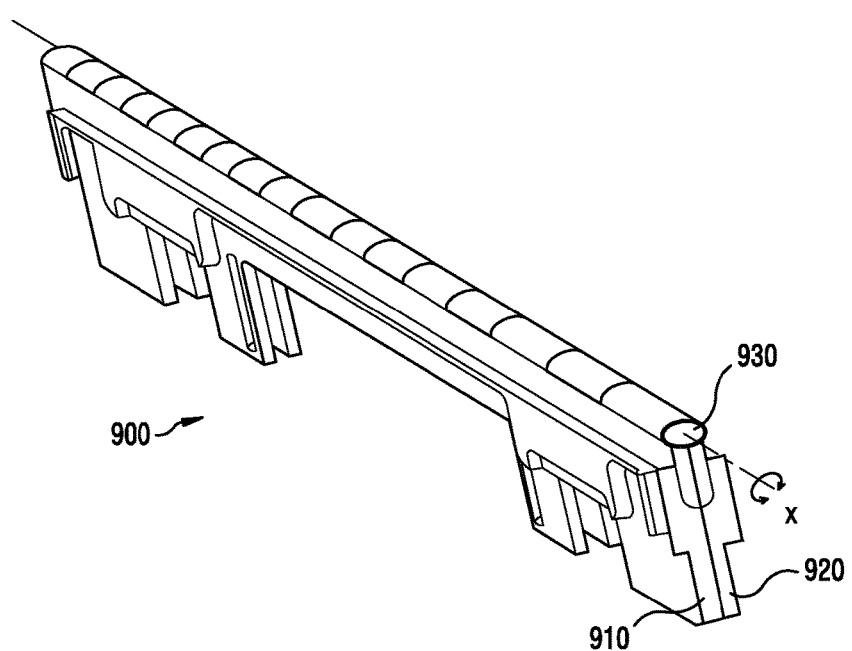
FIG. 9C is a perspective view of the hinge of FIG. 9A in a fully folded state according to an embodiment of the present disclosure.

FIG. 9A is a perspective view of a hinge 900 in a fully unfolded state according to an embodiment of the present disclosure. FIG. 9B is a perspective view of the hinge 900 portion of FIG. 9A in a folded state by a certain angle (e.g., a pre-determined angle). FIG. 9C is a perspective view of the hinge 900 of FIG. 9A in a fully folded state.

The hinge 900 may be similar to the hinge 240 of FIG. 2, or may be another example of a sliding portion. In addition, a detailed description of the same or similar structure as the hinge 240 of FIG. 2 is omitted here.

Referring to FIG. 9A, the hinge 900 may include a first planar portion 910, a second planar portion 920, and a hinge center portion 930 for pivotably coupling the first planar portion 910 and the second planar portion 920. For example, a hinge arm 911 formed at one end of the first planar portion 910 and a hinge arm formed at the second planar portion 920 may be hinge-coupled to constitute the hinge center portion 930. For example, the hinge arm of the first planar portion 910 and the hinge arm of the second planar portion 920, which constitute the hinge center portion 930, may be individually formed in an integral manner with respect to the planar portion, or may be formed separately and fixedly joined. According to an embodiment of the present disclosure, the first planar portion 910 may include a plurality of hinge arms 911. Likewise, the second planar portion 920 may also include a plurality of hinge arms 921. The plurality of hinge arms 911 of the first planar portion 910 and the plurality of hinge arms 921 of the second planar portion 920 may be alternately engaged with each other to constitute the hinge center portion 930. Alternatively, the plurality of hinge arms 911 of the first planar portion 910 and the plurality of hinge arms 921 of the second planar portion 920 may be coupled with each other in a concavo-convex manner.

According to an embodiment of the present disclosure, the first planar portion 910 and the second planar portion 920 may pivot about the hinge center portion 930 as a central axis (X-axis).

Referring to FIGS. 9A, 9B, and 9C, the hinge 900 according to an embodiment of the present disclosure may pivot such that rear surfaces of the first planar portion 910 and the second planar portion 920 face each other. That is, when the foldable electronic device transforms from an unfolded configuration to a folded configuration, in association thereto, the hinge 900 may pivot about the hinge center portion 930. The operation of the hinge 900 during a folding motion of the foldable electronic device is described below in greater detail.

Figure 10A:
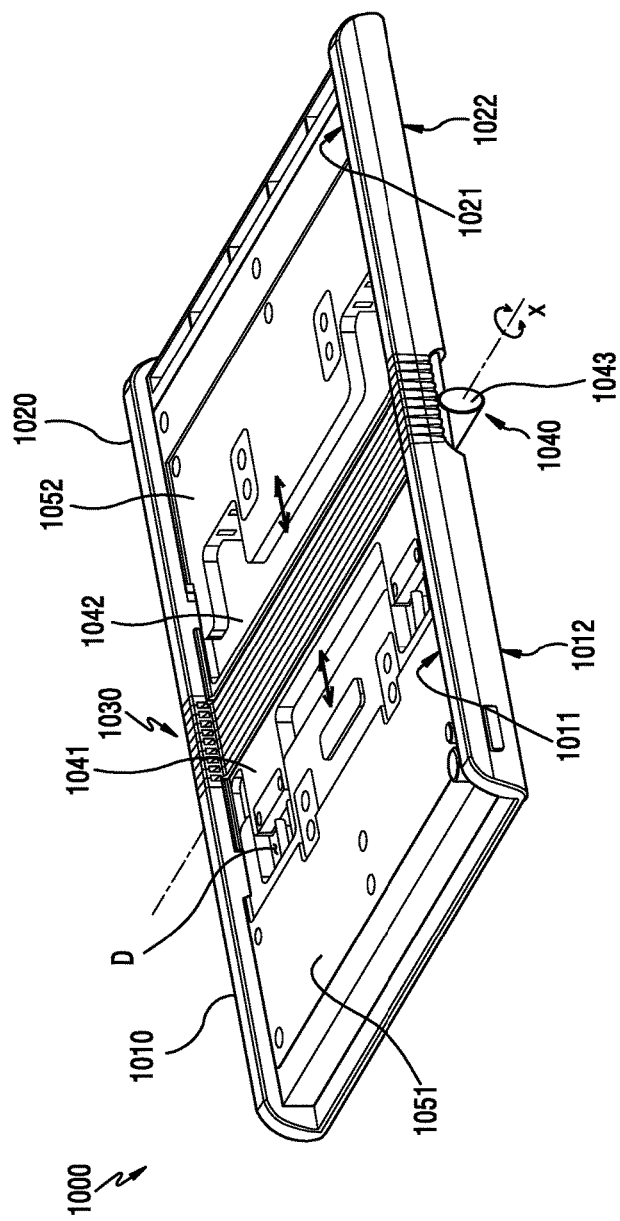
FIG. 10A is a perspective view of a foldable electronic device in a fully unfolded state according to an embodiment of the present disclosure, wherein a flexible display is removed.
Figure 10B:
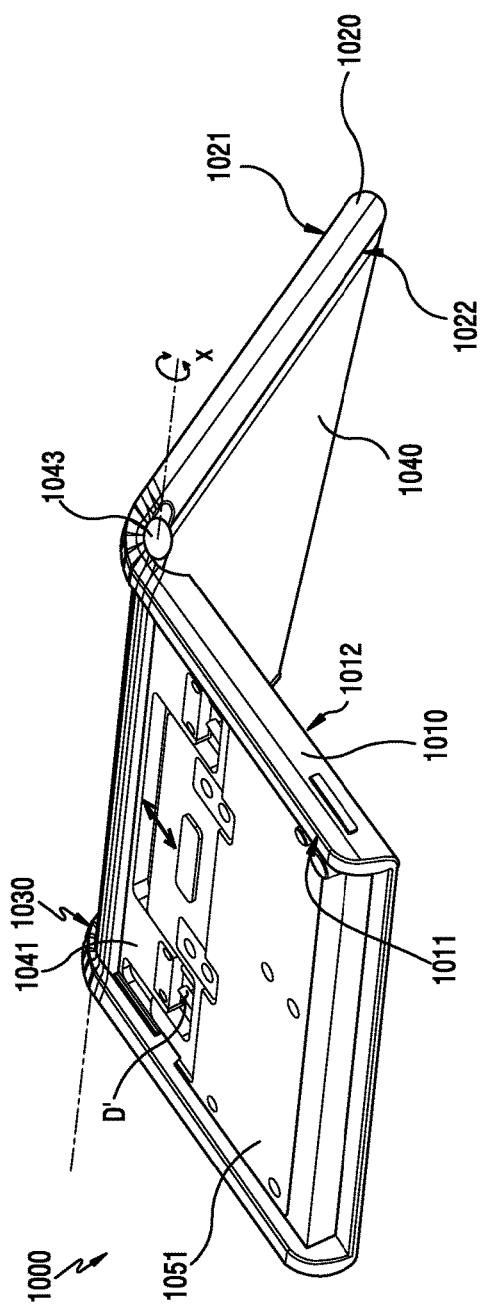
FIG. 10B is a perspective view of the foldable electronic device of FIG. 10A in a folded state by a certain angle according to an embodiment of the present disclosure, wherein a flexible display is removed.
Figure 10C:
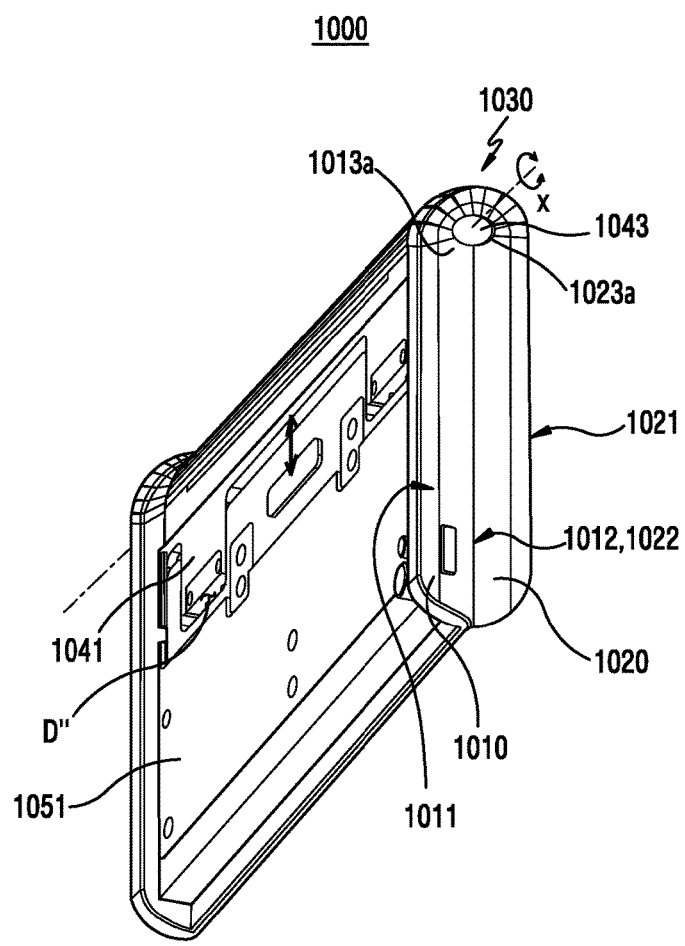
FIG. 10C is a perspective view of the foldable electronic device of FIG. 10A in a fully folded state according to an embodiment of the present disclosure, wherein a flexible display is removed.

FIG. 10A is a perspective view of a foldable electronic device 1000 in a fully unfolded state according to an embodiment of the present disclosure, in which a flexible display is removed. FIG. 10B is a perspective view of the foldable electronic device 1000 of FIG. 10A in a folded state by a certain angle, in which a flexible display is removed. FIG. 10C is a perspective of the foldable electronic device 1000 of FIG. 10A in a fully folded state, in which a flexible display is removed.

Referring to FIGS. 10A, 10B, and FIG. 10C, a sliding motion of a hinge 1040 is described below when the foldable electronic device 1000 performs a folding motion, and a mechanism thereof described above with reference to FIGS. 8A and 8B is described below to cancel a difference in length between a front housing and a rear housing.

According to an embodiment of the present disclosure, a first housing 1010 may include a first surface 1011 and a second surface 1012 facing a direction opposite to the first surface 1011. In addition, a second housing 1020 may include a third surface 1021 and a fourth surface 1022 opposite to the third surface 1021. A folding portion 1030 may pivotably couple the first housing 1010 and the second housing 1020. The hinge 1040 may be disposed on a rear surface of the folding portion 1030. A first planar portion 1041 of the hinge 1040 may be disposed to slidably move on the second surface 1012 of the first housing 1010. A second planar portion 1042 of the hinge 1040 may be disposed to slidably move on the fourth surface 1022 of the second housing 1020. A first bracket 1051 and a second bracket 1052 may be mounted to be inserted, respectively, on inner accommodating spaces of the first housing 1010 and the second housing 1020. That is, the first housing 1010 and the second housing 1020 may play a role of a guide which proposes another motion other than the sliding motion of the hinge 1040. That is, the first planar portion 1041 may slidably move in a direction of the arrow with the first housing 1010 and the first bracket 1051, and the second planar portion 1042 may slidably move in the direction of the arrow with the second housing 1020 and the second bracket 1052. In this case, a sliding motion distance of the first planar portion 1041 may be defined as a distance interval (D, D', D") between the first bracket 1051 and the first planar portion 1041 of the hinge 1040.

Referring to FIG. 10A, in a first configuration of the foldable electronic device 1000 according to an embodiment of the present disclosure, the folding portion 1030 may be fully unfolded such that the first surface 1011 of the first housing 1010 and the third surface 1021 of the second housing 1020 form the same plane. Likewise, in the first configuration of the foldable electronic device 1000, the folding portion 1030 may be fully unfolded such that the second surface 1012 of the first housing 1010 and the fourth surface 1022 of the second housing 1020 form the same plane. As such, the first configuration of the foldable electronic device 1000 may be referred to as an unfolded configuration.

In the first configuration of the foldable electronic device 1000 according to an embodiment of the present disclosure, the hinge 1040 may form the same plane with respect to the second surface 1012 of the first housing 1010 and the fourth surface 1022 of the second housing 1020. In other words, the hinge 1040 may constitute a rear exterior of the foldable electronic device 1000 together with the second surface 1012 of the first housing 1010 and the fourth surface 1022 of the second housing 1020. Alternatively, the hinge 1040 may constitute at least one part of the rear exterior of the foldable electronic device 1000. In this case, that is, in the unfolded configuration, a distance interval D between the first planar portion 1041 and the first bracket 1051 may have a maximum distance.

Referring to FIG. 10C, in a second configuration of the foldable electronic device 1000 according to an embodiment of the present disclosure, the folding portion 1030 may be folded such that the second surface 1012 of the first housing 1010 and the fourth surface 1022 of the second housing 1020 face each other. Alternatively, the first housing 1010 and the second housing 1020 may be folded in such a manner that the folding portion 1030 is curved about a hinge center portion as a central axis (X-axis). In this case, the first planar portion 1041 and second planar portion 1042 of the folding portion 1040 may be folded about the hinge center portion 1043 as the central axis (X-axis) together by interworking with a folding motion of the first housing 1010, the second housing 1020, and the folding portion 1030. Alternatively, in the second configuration of the foldable electronic device 1000, the first surface 1011 of the first housing 1010 and the third surface 1021 of the second housing 1020 may be disposed to be parallel with each other. As such, the second configuration of the foldable electronic device 1000 may be referred to as a folded configuration.

In the second configuration of the foldable electronic device 1000 according to an embodiment of the present disclosure, the second surface 1012 of the first housing 1010 and the fourth surface 1022 of the second housing 1020 may be completely and tightly in contact with each other. In this case, the first and second planar portions 1041 and 1042 of the hinge 1040 may be inserted into respective inner accommodating spaces of the first and second housings 1010 and 1020 while pivoting about the hinge center portion 1043. For example, the first planar portion 1041 may slidably move in an arrow direction in the accommodating space of the first bracket 1051 while being folded about the hinge center portion 1043 with respect to the second planar portion 1042. Therefore, a distance interval D" between the first planar portion 1041 and the first bracket 1051 may be a minimum distance.

According to an embodiment of the present disclosure, the sliding motion of the first planar portion 1041 may cancel a difference in length (or a difference in area) of a front housing and a rear housing, which are generated by the folding motion of the foldable electronic device 1000. In other words, the hinge 1040 constituting a rear exterior together with the second surface 1012 of the first housing 1010 and the fourth surface 1022 of the second housing 1020 may cancel a difference in length between the rear exterior and a front exterior, which occurs depending on the folding motion of the foldable electronic device 1000, in such a manner that the first planar portion 1041 slidably moves in a direction of inserting into an inner accommodating space of the second surface 1012 of the first housing 1010. Therefore, the hinge 1040 has a portion which constitutes the rear surface of the foldable electronic device 1000 and of which an area occupying the exterior of the rear surface is decreased, and may be inserted into an inner accommodating space of the first housing 1010 and the second housing 1020 when in a second configuration in which it is fully unfolded, thereby not contributing to the exterior of the rear surface. That is, in the second configuration of the foldable electronic device 1000, the first planar portion 1041 and the second planar portion 1042 may be completely inserted into an inner accommodating space of each of the first housing 1010 and the second housing 1020.

In the second configuration of the foldable electronic device 1000 according to an embodiment of the present disclosure, the first planar portion 1041 and the second planar portion 1042 of the hinge 1040 may not contribute to the exterior of the foldable electronic device 1000 at all. For example, a first lateral portion 1013*a* of an opening to which first planar portion 1041 of the first housing 1010 is inserted may surround a circular-shaped hinge center portion 1043 when the first planar portion 1041 is completely inserted. Alternatively, a second lateral portion 1023*a* of an opening to which the second planar portion 1042 is inserted may surround the circular-shaped hinge center portion 1043 when the second planar portion 1042 is completely inserted. That is, the first lateral portion 1013*a* and the second lateral portion 1023*a* may surround the hinge center portion 1043 in the second configuration. Alternatively, in the second configuration, a lateral exterior of the foldable electronic device 1000 may be constructed of a lateral surface of the first housing 1010, a lateral surface of the second housing 1020, the folding portion 1030 for coupling the first housing 1010 and the second housing 1020, and the hinge center portion 1043. However, the present disclosure is not limited thereto, and thus the hinge center portion 1043 may include various shapes, and the first lateral portion 1013*a* of the first housing 1010 and the second lateral portion 1023*a* of the second housing 1020 may include a shape corresponding to the shape of the hinge center portion 1043.

Referring to FIG. 10B, in a middle process in which the foldable electronic device 1000 according to an embodiment of the present disclosure operates from the first configuration to the second configuration, the first housing 1010 and the second housing 1020 may be folded by a certain angle about the hinge center portion 1043 as a central axis (X-axis) when the folding portion 1030 is curved. Therefore, the first planar portion 1041 of the hinge 1040 may slidably move in a direction of the arrow in an accommodating space of the first bracket 1041 while being folded about the hinge center portion 1043 relatively with the second planar portion 1042. Therefore, a distance interval D' between the first planar portion 1041 and the first bracket 1051 may have a medium distance between the distance interval D' in the first configuration and a distance interval D" in the second configuration. That is, since each of the first and second planar portions 1040 and 1041 of the hinge 1040 slidably moves by interworking with a folding motion of the foldable electronic device 1000, the hinge 1040 may be referred to as a sliding portion.

According to an embodiment of the present disclosure, since a hinge moves by interworking with a housing, a foldable electronic device in which a reliable folding motion is possible can be provided while cancelling a difference in length between a front surface and a rear surface when the difference occurs due to a folding motion of the foldable electronic device.

Figure 11:
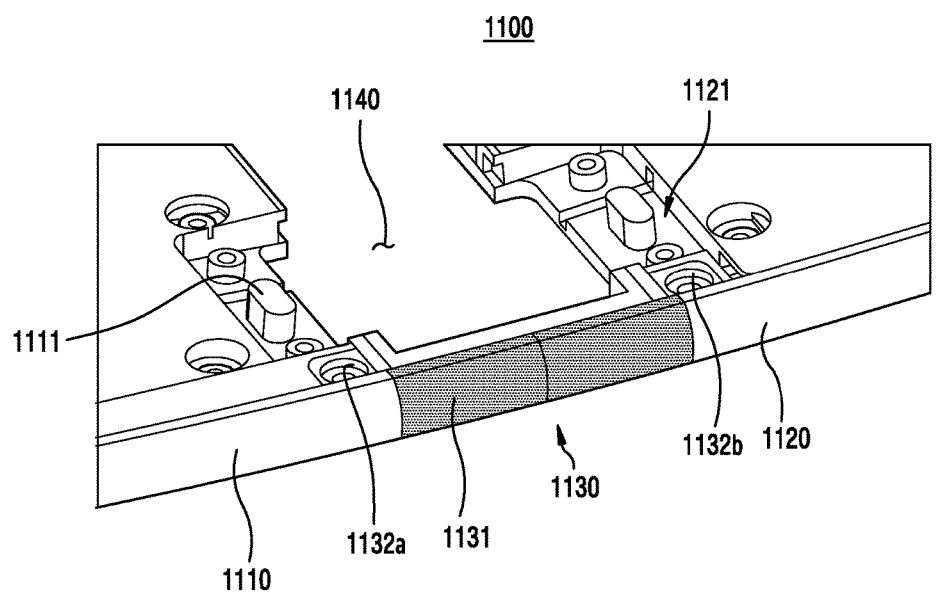
FIG. 11 is a perspective view of a bending portion of a foldable electronic device according to an embodiment of the present disclosure.

FIG. 11 is a perspective of a bending portion of a foldable electronic device 1000 according to an embodiment of the present disclosure.

Referring to FIG. 11, the foldable electronic device 1100 may include a first housing 1110, a second housing 1120, and a bending portion 1130. The first housing 1110 and the second housing 1120 may be pivotably coupled by means of a plurality of folding members. According to an embodiment of the present disclosure, the plurality of folding members may have the same or similar structure as the plurality of folding members described above with reference to FIGS. 3, 4, and 5. The plurality of folding members may be disposed at a space 1140 between the first housing 1110 and the second housing 1120 by being coupled to a first joining portion 1111 of the first housing 1110 and a second joining portion 1121 of the second housing 1120.

According to an embodiment of the present disclosure, the bending portion 1130 may include a body 1131 having a certain length and a first coupling portion 1132*a* and a second coupling portion 1132*b* disposed at both edges of the body 1131. The bending portion 1130 may couple the first housing 1110 and the second housing 1120 at an outermost lateral surface of the first housing 1110 and the second housing 1120. For example, the first coupling portion 1132*a* of the bending portion 1130 may be coupled by being joined with the first housing 1110. Alternatively, the second coupling portion 1132*b* of the bending portion 1130 may be coupled by being joined with the second housing 1120.

According to an embodiment of the present disclosure, the bending portion 1130 may include a shape integrally formed with a lateral surface of the first housing 1110 and the second housing 1120. For example, the body 1131 of the bending portion 1130 may be formed of a soft material (e.g., rubber) and thus may be bent together with a folding motion of the foldable electronic device 1100. When the bending portion 1130 is formed of the soft material, an outer look thereof may be seamlessly simple even if the folding motion is performed. The first coupling portion 1132*a* and the second coupling portion 1132*b* of the bending portion 1130 may be formed of a hard material (e.g., polycarbonate (PC)). When the first coupling portion 1132*a* and the second coupling portion 1132*b* of the bending portion 1131 are formed of the hard material, a coupling structure of the first housing 1110 and the second housing 1120 may be solid. Therefore, the bending portion 1130 may be formed of the soft material and/or the hard material. When the bending portion 1130 is formed of the soft material and the hard material, it may be produced by using a double injection method.

An electronic device according to an embodiment of the present disclosure includes a first housing including a first surface facing a first direction and a second surface facing a second direction opposite to the first direction, a second housing including a third surface facing the first direction and a fourth side facing the second direction, a folding portion for coupling a lateral surface of the first housing and a lateral surface of the second housing corresponding to the lateral surface of the first housing, a flexible display disposed on the first surface and the third surface across the folding portion, and a hinge including a first planar portion disposed on the second surface, a second planar portion disposed on the fourth side, and a hinge center portion for pivotably coupling the first planar portion and the second planar portion. A first configuration may be provided in which the folding portion is unfolded such that the first surface and the third surface form the same plane and thus the first housing and the second housing are disposed in parallel. A second configuration may be provided in which the folding portion is folded in a direction in which the second surface and the fourth side face each other about the hinge center portion such that the first planar portion is at least partially inserted into the first housing and the second planar portion is at least partially inserted into the second housing and thus the first housing and the second housing are disposed in parallel.

In the electronic device according to an embodiment of the present disclosure, the first housing may include a first accommodating space in which the first planar portion can be inserted. The second housing may include a second accommodating space in which the second planar portion can be inserted.

In an embodiment of the present disclosure, depending on a folding motion of the folding portion, the first planar portion may slidably move by being interrupted in a first accommodating space and the second planar portion may slidably move by being interrupted in a second accommodating space.

When the electronic device according to an embodiment of the present disclosure operates in the second configuration, the second surface and the fourth side may be completely engaged, and the first planar portion and the second planar portion may be completely accommodated respectively in the first accommodating space and the second accommodating space.

According to an embodiment of the present disclosure, the first accommodating space may be provided by a first bracket disposed between the first surface and second surface of the first housing. The second accommodating space may be provided by a second bracket disposed between the third surface and fourth side of the second housing.

In the electronic device according to an embodiment of the present disclosure, the first planar portion may include a first guide pin. The first bracket may include a first guide groove for accommodating the first guide pin.

The electronic device according to an embodiment of the present disclosure may include an elastic member disposed between the first guide pin and the first guide groove to provide elastic force in a direction opposite to a direction in which the first guide pin is accommodated in the first guide groove.

In the electronic device according to an embodiment of the present disclosure, the elastic member may be a spring member for coupling the first guide pin in a surrounding manner.

In the electronic device according to an embodiment of the present disclosure, the first planar portion may include at least one protrusion. The first bracket may include at least one guide groove for accommodating the at least one protrusion.

In the electronic device according to an embodiment of the present disclosure, the first planar portion may include a first hinge arm on one lateral surface in a direction for coupling with the second planar portion. The second planar portion may include a second hinge arm on one lateral surface in a direction of coupling with the first planar portion.

In the electronic device according to an embodiment of the present disclosure, the first hinge arm and the second hinge arm may be coupled to constitute the hinge center portion.

In the electronic device according to an embodiment of the present disclosure, the folding portion may include a plurality of coupling members pivotably coupled to each other.

In the electronic device according to an embodiment of the present disclosure, the plurality of coupling members may be curved by pivoting with each other when the first housing and the second housing pivot about the hinge center portion.

In the electronic device according to an embodiment of the present disclosure, each of the plurality of coupling members may include a main body having a certain length, both end portions disposed at both edges of the main body to form an outer circumferential surface, and a stopper protruding in the first direction at both end portions. The stoppers of the plurality of coupling members may be mutually interrupted so as not to pivot by more than a certain angle when the plurality of coupling members pivot with each other.

The electronic device according to an embodiment of the present disclosure further includes a link portion exposed to the outside at both edges of the folding portion. The link portion may be formed of a soft material.

An electronic device according to an embodiment of the present disclosure includes first and second housings having a certain thickness, a folding portion disposed between the first housing and the second housing so as to be folded by pivoting in a first configuration in which the first housing and the second housing are unfolded and a second configuration in which the first housing and the second housing overlap with each other, a flexible display disposed on front surfaces of the first and second housings to substantially constitute the entirety of a front surface of the electronic device, and a sliding portion disposed on rear surfaces of the first and second housings to constitute at least one part of a rear surface of the electronic device. The sliding portion may be at least partially inserted into an inner side of the first housing and the second housing to cancel a difference in area which occurs between front and rear surfaces of the electronic device when transforming from the first configuration to the second configuration depending on a folding motion of the folding portion.

In the electronic device according to an embodiment of the present disclosure, the sliding portion may include a first planar portion slidably disposed at an inner side of a rear surface of the first housing, a second planar portion slidably disposed at an inner side of a rear surface of the second housing, and a hinge center portion for pivotably coupling the first planar portion and the second planar portion. The hinge center portion may be disposed at a center of the folding portion.

In the electronic device according to an embodiment of the present disclosure, the folding portion may be folded about the hinge center portion. Depending on the folding motion, the first planar portion and the second planar portion may pivot about the hinge center portion, while the first planar portion is slid into an inner side of the first housing and the second planar portion is slid into an inner side of the second housing.

In the electronic device according to an embodiment of the present disclosure, the folding portion may include a plurality of folding members. The folding motion of the folding portion may be provided by mutually pivoting the plurality of folding members with a certain curvature.

In the electronic device according to an embodiment of the present disclosure, a first end of the first housing and a second end of the second housing opposite to the first end may include a round shape. The flexible display may be disposed from the first end to the second end. The electronic device may provide a flexible display seamlessly in a circumferential direction of the electronic device in such a manner that the first end and the second and are disposed to be engaged when being in the second configuration.

According to various embodiments of the present disclosure as described above, a foldable electronic device capable of performing a reliable folding motion can be provided while cancelling a difference in area occurring between front and rear surfaces of the foldable electronic device due to the folding motion of the foldable electronic device since a hinge or a sliding portion moves on the rear surface of the foldable electronic device by interworking with a folding portion for performing the folding motion.

Various embodiments of the present disclosure disclosed in the present disclosure and the accompanying drawings are merely examples presented for clarity and are not intended to limit the scope of the present disclosure. Therefore, in addition to the embodiments disclosed herein, various changes in form and detail made without departing from the scope of the present disclosure as defined by the appended claims and their equivalents.

What is claimed is:

1. An electronic device, comprising:
   a first housing comprising a first surface facing a first direction and a second surface facing a second direction opposite to the first direction;
   a second housing comprising a third surface facing the first direction and a fourth surface facing the second direction;
   a folding portion configured to couple a lateral surface of the first housing and a lateral surface of the second housing;
   a flexible display disposed on the first surface and the third surface across the folding portion; and
   a hinge comprising a first planar portion disposed on the second surface, a second planar portion disposed on the fourth surface, and a hinge center portion configured to pivotably couple the first planar portion and the second planar portion,
   wherein a first configuration is configured in which the folding portion is unfolded such that the first surface and the third surface form a plane and the first housing and the second housing are parallel,
   wherein a second configuration is configured in which the folding portion is folded in a direction in which the second surface and the fourth surface face each other about the hinge center portion such that the first planar portion is at least partially inserted into the first housing and the second planar portion is at least partially inserted into the second housing and the first housing and the second housing are parallel,
   wherein the first housing further comprises a first accommodating space in which the first planar portion can be inserted,
   wherein the second housing further comprises a second accommodating space in the second planar portion can be inserted, and
   wherein the folding portion comprises a plurality of coupling members pivotably coupled to each other.

2. The electronic device of claim 1, wherein, depending on a folding motion of the folding portion, the first planar portion slidably moves by being interrupted in a first accommodating space, and the second planar portion slidably moves by being interrupted in a second accommodating space.

3. The electronic device of claim 2, wherein, when the electronic device operates in the second configuration, the second surface and the fourth surface are completely engaged, and the first planar portion and the second planar portion are completely accommodated, respectively, in the first accommodating space and the second accommodating space.

4. The electronic device of claim 1,
   wherein the first accommodating space comprises a first bracket disposed between the first surface and second surface of the first housing, and
   wherein the second accommodating space comprises a second bracket disposed between the third surface and fourth surface of the second housing.

5. The electronic device of claim 4,
   wherein the first planar portion comprises a first guide pin, and
   wherein the first bracket comprises a first guide groove configured to accommodate the first guide pin.

6. The electronic device of claim 5, further comprising an elastic member disposed between the first guide pin and the first guide groove to provide elastic force in a direction opposite to a direction in which the first guide pin is accommodated in the first guide groove.

7. The electronic device of claim 6, wherein the elastic member is a spring member configured to couple the first guide pin in a surrounding manner.

8. The electronic device of claim 4,
   wherein the first planar portion comprises at least one protrusion, and
   wherein the first bracket comprises at least one guide groove configured to accommodate the at least one protrusion.

9. The electronic device of claim 1,
   wherein the first planar portion comprises a first hinge arm on one lateral surface in a direction configured to couple to the second planar portion, and
   wherein the second planar portion comprises a second hinge arm on one lateral surface in a direction configured to couple to the first planar portion.

10. The electronic device of claim 9, wherein the hinge center portion is comprised of the first hinge arm coupled to the second hinge arm.

11. The electronic device of claim 1, wherein the plurality of coupling members are configured to be curved by pivoting with each other when the first housing and the second housing pivot about the hinge center portion.

12. The electronic device of claim 11, wherein each of the plurality of coupling members comprises:
   a main body having a pre-determined length;
   both end portions disposed at both edges of the main body to form an outer circumferential surface; and
   a stopper protruding in the first direction at both end portions,
   wherein the stoppers of the plurality of coupling members are mutually interrupted so as not to pivot by more than a pre-determined angle when the plurality of coupling members pivot with each other.

13. The electronic device of claim 1, further comprising a link portion exposed to an outside at both edges of the folding portion, wherein the link portion is formed of a soft material.

14. An electronic device, comprising:
   a first housing and a second housing having a pre-determined thickness;
   a folding portion disposed between the first housing and the second housing and configured to be folded by pivoting in a first configuration in which the first housing and the second housing are unfolded and a second configuration in which the first housing and the second housing overlap with each other;
   a flexible display disposed on front surfaces of the first and second housings to substantially constitute an entirety of a front surface of the electronic device;
   a sliding portion disposed on rear surfaces of the first and second housings to constitute at least one part of a rear surface of the electronic device;
   a first planar portion slidably disposed at an inner side of a rear surface of the first housing; and
   a second planar portion slidably disposed at an inner side of a rear surface of the second housing, wherein the sliding portion is at least partially inserted into an inner side of the first housing and the second housing to offset a difference in area which occurs between front and rear surfaces of the electronic device when transforming from the first configuration to the second configuration depending on a folding motion of the folding portion, wherein the first housing further comprises a first accommodating space in which the first planar portion can be inserted, wherein the second housing further comprises a second accommodating space in which the second planar portion can be inserted, and wherein the folding portion comprises a plurality of coupling members pivotably coupled to each other.

15. The electronic device of claim 14, wherein the sliding portion comprises:

a hinge center portion for pivotably coupling the first planar portion and the second planar portion, wherein the hinge center portion is disposed at a center of the folding portion.

16. The electronic device of claim 15, wherein the folding portion is folded about the hinge center portion, and wherein, depending on the folding motion, the first planar portion and the second planar portion pivot about the hinge center portion, while the first planar portion is slid into an inner side of the first housing and the second planar portion is slid into an inner side of the second housing.

17. The electronic device of claim 16, wherein the folding portion comprises a plurality of folding members, and wherein the folding motion of the folding portion is configured by mutually pivoting the plurality of folding members with a pre-determined curvature.

18. The electronic device of claim 14, wherein a first end of the first housing and a second end of the second housing opposite to the first end comprise a round shape, wherein the flexible display is disposed from the first end to the second end, and wherein the electronic device further comprises a flexible display seamlessly in a circumferential direction of the electronic device, wherein the first end and the second end are engaged in the second configuration.

* * * * *